US010325855B2

(12) United States Patent
Kim et al.

(10) Patent No.: US 10,325,855 B2
(45) Date of Patent: Jun. 18, 2019

(54) BACKSIDE DRILL EMBEDDED DIE SUBSTRATE

(71) Applicant: QUALCOMM Incorporated, San Diego, CA (US)

(72) Inventors: Daeik Kim, Del Mar, CA (US); Jie Fu, San Diego, CA (US); Changhan Yun, San Diego, CA (US); Chin-Kwan Kim, San Diego, CA (US); Manuel Aldrete, Encinitas, CA (US); Chengjie Zuo, Santee, CA (US); Mario Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/074,750

(22) Filed: Mar. 18, 2016

(65) Prior Publication Data

US 2017/0271266 A1 Sep. 21, 2017

(51) Int. Cl.
*H01L 23/538* (2006.01)
*H01L 21/48* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/76898* (2013.01); *H01L 23/481* (2013.01); *H01L 23/49827* (2013.01); *H01L 23/5383* (2013.01);
(Continued)

(58) Field of Classification Search
CPC .................................................. H01L 23/5389
See application file for complete search history.

(56) References Cited

U.S. PATENT DOCUMENTS 6,744,135 B2 * 6/2004 Hasebe ................. H01L 23/142
257/707
8,084,850 B2 12/2011 Shin
(Continued)

FOREIGN PATENT DOCUMENTS

DE 102014112407 A1 11/2015

OTHER PUBLICATIONS

International Search Report and Written Opinion—PCT/US2017/022829—ISA/EPO—May 30, 2017.(155280W0).

*Primary Examiner* — Wael M Fahmy
*Assistant Examiner* — Sarah K Salerno
(74) *Attorney, Agent, or Firm* — Loza & Loza, LLP/Qualcomm

(57) ABSTRACT

A device and method of fabricating are provided. The device includes a substrate having a first side and an opposite second side, a cavity defined within the substrate from the first side, a die coupled to a floor of the cavity and having a conductive pad on a side of the die distal to the floor of the cavity. A laminate layer coupled to the second side of the substrate may be included. A hole may be drilled, at one time, through layers of the device, through the die, and through the conductive pad. The hole extends through and is defined within the laminate layer (if present), the second side of the substrate, the die, and the conductive pad. A conductive material is provided within the hole and extends between and through the laminate layer (if provided), the second side of the substrate, the die, and the conductive pad.

28 Claims, 13 Drawing Sheets

(51) Int. Cl.
*H01L 21/768* (2006.01)
*H01L 23/48* (2006.01)
*H01L 23/498* (2006.01)
*H01L 23/00* (2006.01)

(52) U.S. Cl.
CPC .......... *H01L 23/5384* (2013.01); *H01L 24/19* (2013.01); *H01L 24/20* (2013.01); *H01L 24/25* (2013.01); *H01L 24/97* (2013.01); *H01L 23/49822* (2013.01); *H01L 2224/04105* (2013.01); *H01L 2224/06181* (2013.01); *H01L 2224/2518* (2013.01); *H01L 2224/291* (2013.01); *H01L 2224/2919* (2013.01); *H01L 2224/32225* (2013.01); *H01L 2224/73267* (2013.01); *H01L 2224/82039* (2013.01); *H01L 2224/82047* (2013.01); *H01L 2224/92244* (2013.01); *H01L 2224/97* (2013.01); *H01L 2924/14* (2013.01); *H01L 2924/15153* (2013.01)

(56) References Cited

U.S. PATENT DOCUMENTS

| | | | |
|---|---|---|---|
| 8,237,255 B2 | 8/2012 | Kim et al. | |
| 2002/0020898 A1* | 2/2002 | Vu | H01L 21/56 257/676 |
| 2004/0113261 A1 | 6/2004 | Sunohara et al. | |
| 2006/0191711 A1* | 8/2006 | Cho | H01L 23/5389 174/260 |
| 2008/0048310 A1 | 2/2008 | Zeng | |
| 2011/0204505 A1 | 8/2011 | Pagaila et al. | |
| 2012/0153493 A1 | 6/2012 | Lee et al. | |
| 2013/0292808 A1 | 11/2013 | Yen et al. | |
| 2013/0337648 A1 | 12/2013 | Lin et al. | |
| 2015/0318246 A1* | 11/2015 | Yu | H01L 23/5384 257/774 |
| 2016/0013151 A1* | 1/2016 | Shen | H01L 25/0652 257/686 |

\* cited by examiner

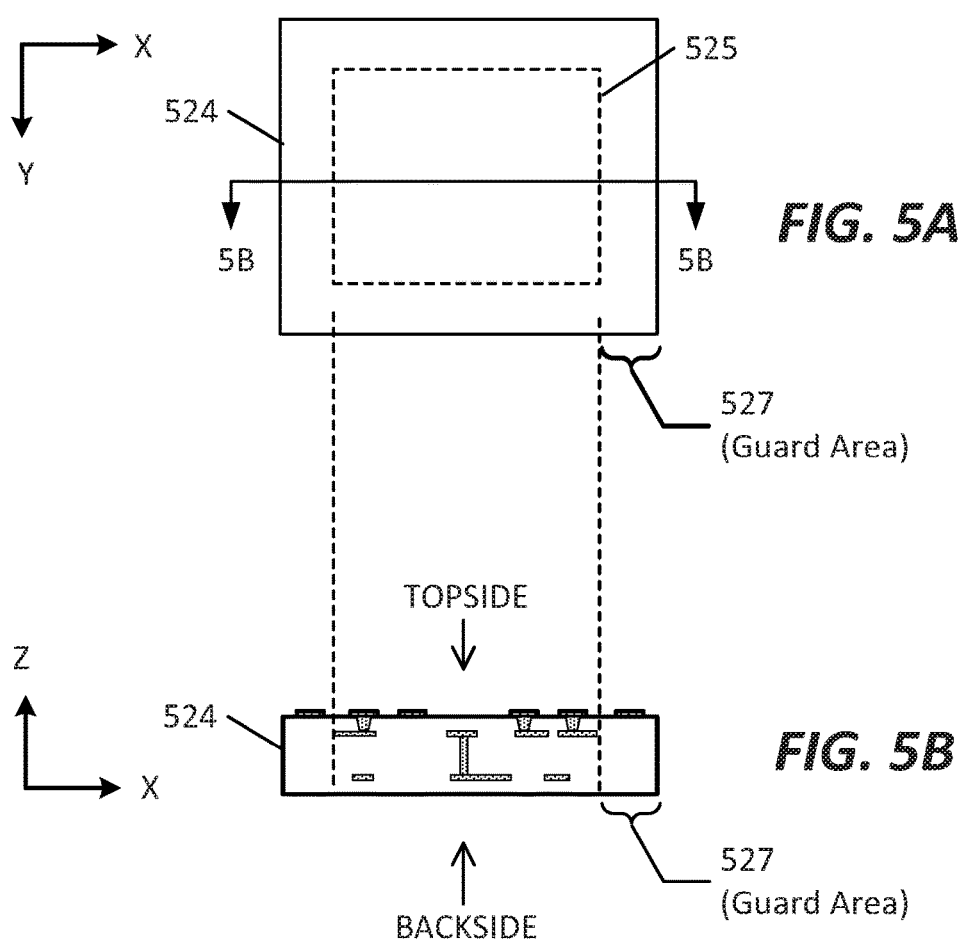

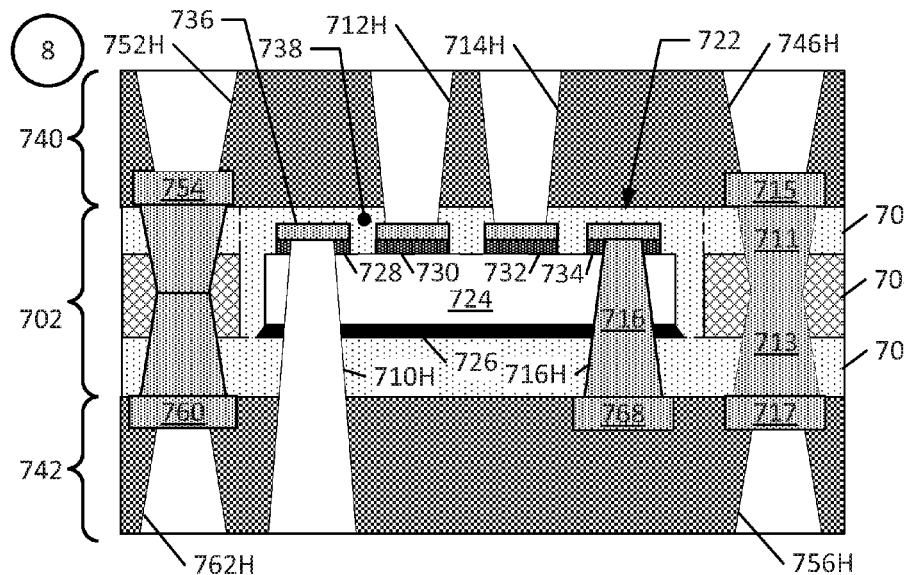
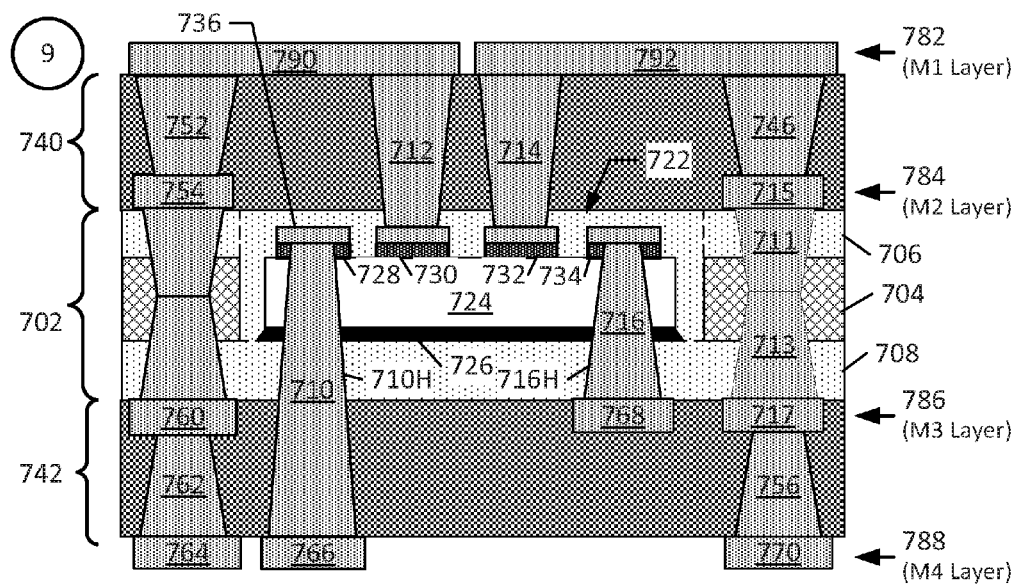
FIG. 7C

BACKSIDE DRILL EMBEDDED DIE SUBSTRATE

FIELD OF THE DISCLOSURE

Various features relate generally to an embedded die substrate, and more specifically to an embedded die substrate in which a die is penetrated during a backside drilling process to expose a conductive pad from within the die.

BACKGROUND

The demand for handheld and wearable electronic devices continues to grow. Examples of handheld electronic devices include mobile cellular telephones, imaging device (e.g., cameras), music devices (e.g., MP3 players), and devices that integrate the functionality of one or more of the just-mentioned devices. Examples of wearable electronic devices include eyeglasses that may integrate the functionality of an imaging device, a video display, and an Internet access terminal. An additional example of a wearable device includes a wrist-wearable device that may integrate the functionality of devices that monitor/record/transmit a user's physiological parameters (e.g., heart rate, blood oxygen level, restlessness during sleep) and/or geographic location. Wrist-wearable devices may additionally or alternatively integrate the functionality of mobile cellular devices with color displays. Many handheld and wearable electronic devices integrate with some form of wireless communication. Users expect new features, additional memory, and improved performance with each iteration of an electronic device. Moreover, users expect that their devices will remain the same size or be reduced in size despite the incorporation of new features, additional memory, and improved performance.

To reduce size, devices may be designed with an increase in transistor density and/or a decrease in the size of the die incorporated within the device. At least for protection and integration purposes, the die can be mounted into packages. To reduce package size, wire-bonding of die into packages has given way to flip-chip bonding. Package forms, such as the ball grid array, are also used to reduce overall size of the devices.

Vertical integration of die/packages has also helped to reduce the overall size of electronic devices. In vertically integrated designs, dies/packages may be stacked one atop the other. Examples of dies/packages stacked vertically include the package on package (PoP) structure. The PoP structure may be comprised of a vertical stack of ball grid array packages.

Another structure used for vertical integration is known as an embedded die substrate or embedded laminate substrate (referred to herein for consistency as embedded die substrate (EDS)). An EDS may employs a multiple layer substrate. To reduce vertical size, instead of mounting active die and/or active/passive components to the top of the multiple layer substrate, the active die and/or active/passive components are mounted within a cavity in the multiple layer substrate.

Use of EDS may reduce vertical size but difficulties remain in implementation. For example, in an EDS implementation, access to pads on a topside (e.g., first side) of a die from nodes adjacent to an opposite backside (e.g., second side) of the die may involve use of die that are costly to fabricate. It is therefore desirable, for example, to reduce the costs of die used in EDS implementations yet maintain access to pads on a topside of the die from nodes adjacent to a backside of the die.

SUMMARY

The aspects disclosed herein provide a device and methods of fabricating the device such as an embedded die substrate.

According to one aspect, a device may include a substrate having a first side and an opposite second side. The device may further include a cavity defined within the substrate from the first side and a die coupled to a floor of the cavity. The die may have a conductive pad on a side of the die distal to the floor of the cavity. The device may further include a hole extending through and defined within the second side of the substrate, the die, and the conductive pad. The device may still further include a conductive material within the hole and extending between and through the second side of the substrate and the conductive pad. The conductive material may form, or be described as, an interconnect. In more specific terms, the conductive material may form, or be described as, a single-segment die-penetrating interconnect.

In some implementations, the substrate is a core substrate including a conductive layer sandwiched between a first dielectric layer at the first side of the substrate and a second dielectric layer at the second side of the substrate. In some examples, when the substrate is such a core substrate, the cavity is devoid of the first dielectric layer and the conductive layer, and the floor of the cavity is defined by the second dielectric layer exposed in the cavity.

In an aspect, the hole is continuous through the second side of the substrate, the die, and the conductive pad. In an aspect, the hole is concentric along a linear axis extending through the second side of the substrate, the die, and the conductive pad. In an aspect, the hole is a single linear hole along a length of the hole.

In an aspect, the conductive material is a unitary single-segment. The conductive material includes only one layer.

According to another aspect, a device may include a substrate having a first side and an opposite second side. The device may further include a cavity defined within the substrate from the first side and a die coupled to a floor of the cavity. The die may have a conductive pad on a side of the die distal to the floor of the cavity. The device may still further include a laminate layer coupled to the second side of the substrate. In such an aspect, the second side of the substrate is sandwiched between the die and the laminate layer. The device may further include a hole extending through and defined within the laminate layer, the second side of the substrate, the die, and the conductive pad. The device may still further include a conductive material within the hole and extending between and through the laminate layer, the second side of the substrate, the die, and the conductive pad. The conductive material may form, or be described as, an interconnect. In more specific terms, the conductive material may form, or be described as, a single-segment die-penetrating interconnect.

In some implementations, the substrate is a core substrate including a conductive layer sandwiched between a first dielectric layer at the first side of the substrate and a second dielectric layer at the second side of the substrate.

In an aspect, the hole is continuous through the laminate layer, the second side of the substrate, the die, and the conductive pad. In an aspect, the hole is concentric along a linear axis extending through the laminate layer, the second side of the substrate, the die, and the conductive pad. In an aspect, the hole is a single linear hole along a length of the hole.

In an aspect, the conductive material is a unitary single-segment. The conductive material includes only one layer.

In an aspect, the device is incorporated into a device selected from a group including at least one of a mobile device, a hand-held personal communication system (PCS) unit, a personal digital assistant, a portable data terminal, a global positioning system (GPS) enabled device, a navigation device, a set top box, a music player, a video player, an entertainment unit, a fixed location terminal, a communications device, a mobile phone, a smartphone, a tablet computer, a computer, a wearable device, an Internet of things (IoT) device, a laptop computer, a server, a router, and an electronic device implemented in an automotive vehicle.

According to another aspect, the device may include a substrate having a first side and an opposite second side. The device may further include a cavity defined within the substrate from the first side and a die coupled to a floor of the cavity. The die may have a conductive pad on a side of the die distal to the floor of the cavity. The device may further include means for an interconnect to penetrate the substrate and the die and couple the conductive pad to a node opposite to the conductive pad on the second side of the substrate. According to one example, the means for the interconnect may include a hole extending through and defined within the second side of the substrate, the die, and the conductive pad, and may further include a conductive material within the hole and extending between and through the second side of the substrate and the conductive pad. According to another example, the means for the interconnect may be continuous through the second side of the substrate, the die, and the conductive pad. According to still another example, the means for the interconnect may be concentric along a linear axis extending through the second side of the substrate, the die, and the conductive pad. In another example, the means for the interconnect includes a single linear hole along a length of the hole. In still another example, the means for the interconnect includes a conductive material formed as a unitary single-segment that couples to the conductive pad from within the conductive pad.

Another aspect described herein provides a method of fabricating an embedded die substrate. The method includes providing a substrate having a first side and an opposite second side. The method further includes forming a cavity defined within the substrate from the first side. The method further includes coupling a die to a floor of the cavity, the die having a conductive pad on a side of the die distal to the floor of the cavity. In an aspect, the method also includes drilling a hole extending through and defined within the second side of the substrate, the die, and the conductive pad. The method still further includes plating and/or filling the hole with a conductive material extending between and through the second side of the substrate, the die, and the conductive pad, and that couples to the conductive pad from within the hole.

In some implementations, the die is coupled to the floor of the cavity before drilling the hole. In an aspect, drilling the hole is performed at one time. Thus, the hole is drilled through the second side of the substrate, the die, and the conductive pad in one process. In an aspect, the hole is formed to be concentric along a linear axis extending through the second side of the substrate, the die, and the conductive pad. In an aspect, the hole is formed to be a single linear hole along a length of the hole.

In an aspect, the conductive material is formed as a unitary single-segment. In some implementations, the conductive material extending between and through the second side of the substrate, the die, and the conductive pad is formed as only one layer. In another aspect, the method my further include coupling a laminate layer to the second side of the substrate, wherein, the hole is further drilled to extend through and be defined within the laminate layer, and the conductive material further extends between and through the laminate layer.

Another aspect described herein provides another method of fabricating an embedded die substrate. The method includes providing a substrate having a first side and an opposite second side. The method further includes forming a cavity defined within the substrate from the first side. The method still further includes, coupling a die to a floor of the cavity, the die having a conductive pad on a side of the die distal to the floor of the cavity. The method still further includes coupling a laminate layer to the second side of the substrate. In an aspect, the method also includes drilling a hole extending through and defined within the laminate layer, the second side of the substrate, the die, and the conductive pad. the method still further includes plating and/or filling the hole with a conductive material extending between and through the laminate layer, the second side of the substrate, the die, and the conductive pad, and that couples to the conductive pad from within the hole.

In some implementations, the die is coupled to the floor of the cavity and the laminate layer is coupled to the second side of the substrate before drilling the hole. In an aspect, drilling the hole is performed at one time. In an aspect, the hole is formed to be concentric along a linear axis extending through the laminate layer, the second side of the substrate, the die, and the conductive pad. In an aspect, the hole is formed to be a single linear hole along a length of the hole.

In an aspect, the conductive material is formed as a unitary single-segment. In some implementations, the conductive material extending between and through the laminate layer, the second side of the substrate, the die, and the conductive pad is formed as only one layer. In one example, the conductive material forms an interconnect between a surface of the laminate layer distal to the second side of the substrate and the conductive pad.

DRAWINGS

Various features, nature, and advantages may become apparent from the detailed description set forth below when taken in conjunction with the drawings in which like reference characters identify correspondingly throughout.

FIG. 5A illustrates a backside plan view of a die that may be installed in an EDS according to aspects described herein.

FIG. 5B illustrates a cross-sectional view of the die of FIG. 5A taken along the line 5B-5B.

DETAILED DESCRIPTION

Figure 1:
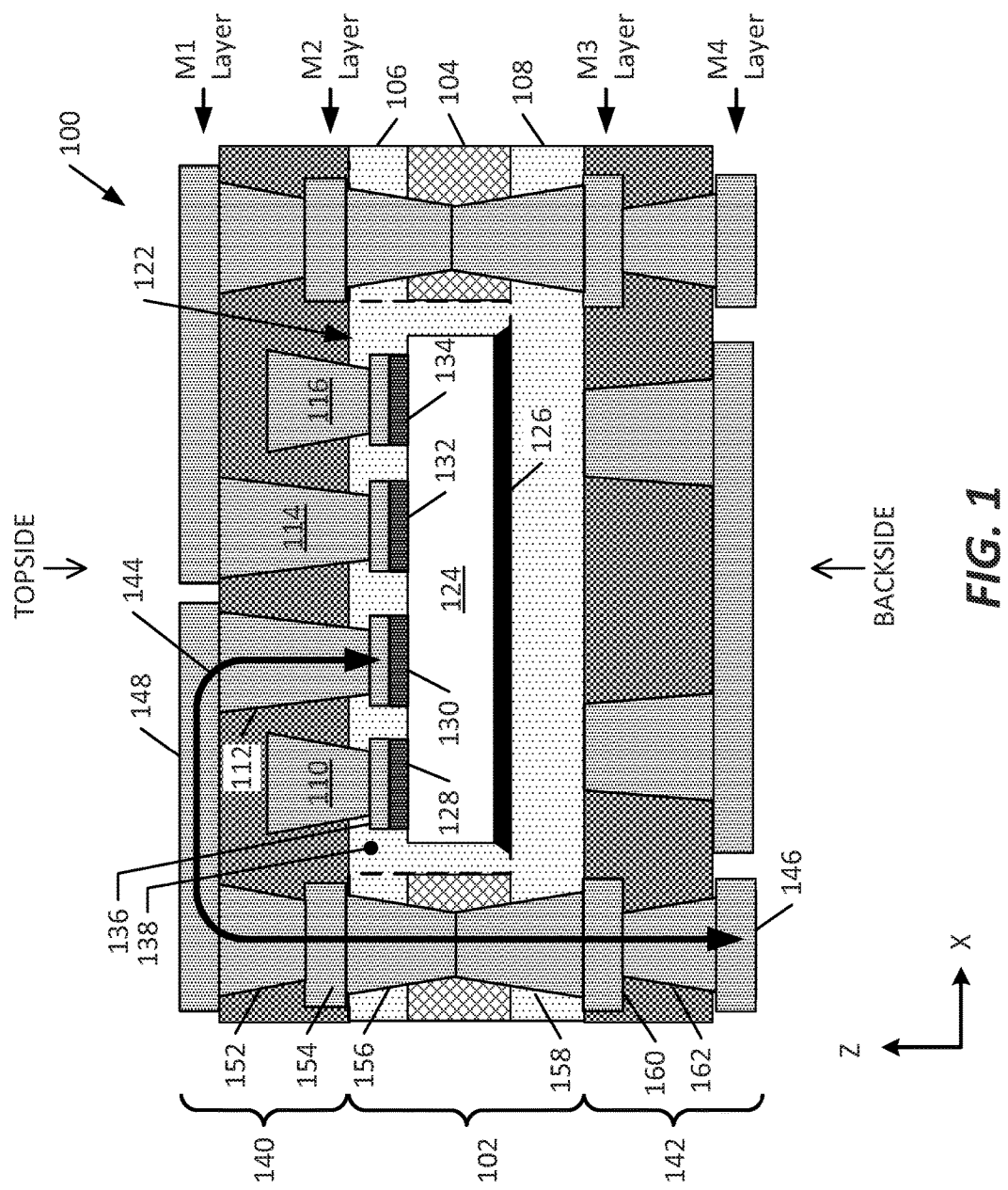
FIG. 1 illustrates a cross-sectional view of an example of an embedded die substrate (EDS) implementing a first type of die according to one approach.

In the following description, specific details are given to provide a thorough understanding of the various aspects of the disclosure. However, it will be understood by one of ordinary skill in the art that the aspects may be practiced without the specific details given herein. For example, circuits may be shown in block diagrams in order to avoid obscuring the aspects in unnecessary detail. In other instances, well-known circuits, structures, and techniques may not be shown in detail in order not to obscure the aspects of the disclosure.

In some implementations, the height of a die may be defined along the Z-direction of the die, which is shown in the figures of the present disclosure. In some implementations, the Z-direction of the die may be defined along an axis between a first side (e.g., a topside) and an opposite second side (e.g., a backside) of the die. The terms topside (or top) and backside (or bottom) may be arbitrarily assigned; however as an example, a topside surface of a die may be a portion comprising a majority of the input/output pads, while a backside surface of the die may be a portion that is bonded, adhered, or otherwise attached to a substrate. In some implementations, the topside portion of the die may be a backside of the die, and the backside portion of the die may be a topside of the die. A topside portion may be a higher portion relative to a lower backside portion. A backside portion may be a lower portion relative to a higher topside portion. Further examples of topside portions and backside portions will be further described below. The X-Y directions of the die may refer to the lateral direction and/or footprint of the die. Examples of X-Y directions are shown in the figures of the present disclosure and/or further described below. In many of the figures of the present disclosure, the die and portions of an EDS may be shown across an X-Z cross-section or X-Z plane. However, in some implementations, the die and portions of the EDS may be represented across a Y-Z cross-section or Y-Z plane.

In some implementations, an interconnect is an element or component of a die, EDS, device, or package that allows or facilitates an electrical and/or a thermal coupling between two points, elements, and/or components. In some implementations, an interconnect may include a trace and/or a plated and/or filled hole (e.g., a via). In some implementations, an interconnect may be formed of cascaded segments (layers), such as a plurality of vias connected in series; such an interconnect may be referred to herein as a segmented interconnect. Segmented interconnects may include seams between segments (e.g., layers), at least because separate segments may be formed during separate operations during processing. Therefore, a segmented interconnect, such as a segmented interconnect formed of a cascaded stack of vias, may have seams, between segments, along the length of the segmented interconnect, transverse to the length of the segmented interconnect. In contrast, in some implementations, an interconnect may be formed of only one segment (e.g., only one layer); such an interconnect may be referred to herein as a single-segment interconnect (i.e., a non-segmented interconnect). Single-segment interconnects may have no seams along the length of the single-segment interconnect, transverse to the length of the single-segment interconnect. In some implementations, an interconnect may be fabricated with an electrically conductive material that may be configured to provide an electrical path for a signal (e.g., data signal, ground signal, power signal) from a first node to a second node. In some implementations, an interconnect may be fabricated with a thermally conductive material that may be configured to provide a thermal path from a first node to a second node. An interconnect may be electrically and/or thermally conductive. An interconnect may be part of a circuit. A non-exclusive list of examples of conductive materials include gold, silver, and copper. The conductive material may be a conductive paste.

As used herein, drilling (e.g., drilling a hole) may be implemented with processes that include, for example, a photolithography process, a mechanical process, and/or a laser drilling process.

As used herein, a hole may be a cavity, opening, or void in a physical object that is defined by sidewall(s) formed in the physical object.

In a multi-layer device, it is customary to identify the uppermost metallization layer as a first metallization layer or an "M1" layer. Each lower metallization layer is customarily incremented by one. The exemplary EDSs presented herein are illustrated with four metallization layers (M1, M2, M3, M4). However, EDSs according to the aspects described herein may be presented with any number of metallization layers. Nothing herein in intended to limit the number of metallization layers of an EDS.

Overview

Some features pertain to an embedded die substrate (EDS) that includes a substrate having a conductive layer sandwiched between opposing dielectric layers, a cavity in the substrate, a die mounted to the substrate within the cavity, and pre-preg layers laminated to the dielectric layers on the opposing sides of the substrate. At least one single-segment interconnect (e.g., a hole plated and/or filled with one continuous length of one conductive material) extends through a pre-preg layer on a backside of the EDS, a dielectric layer of the substrate, and into the die. The single-segment interconnect can electrically and/or thermally couple a conductive pad on a first side (e.g., topside) of the die to a conductive pad on an opposite second side (e.g., backside) of the pre-preg layer. The single-segment interconnect, including the portion within the die, may be formed during a backside drilling process of the EDS, after the die is coupled (e.g., mounted) to the substrate within the cavity. Forming the single-segment interconnect (including the portion within the die) at a pre-designated location during a backside drilling process of the EDS can result in reduction of the cost of the die and reduction of the cost of integration of the die into the EDS, in comparison, for example, to use of a die with a previously formed through substrate via (TSV) at a location corresponding to the pre-designated location in the EDS. Additionally, forming the single-segment interconnect (including the portion within the die) at a pre-designated location during the backside drilling process of the EDS permits the single-segment interconnect to be fabricated with one conductive material, along its entire length, that can be selected to minimize thermal dissipation ground resistance.

Exemplary Embedded Die Substrate Die Types

EDS generally use one of two types of die. A first type of die has input/output/ground/power pads on a topside surface of the die. Use of the first type of die in EDS presents issues for routing. All routing can begin (or end) on the topside surface of the die. Routing to layers of the EDS below the first type of die may make use of traces routed up from and over the die. Routing traces up from and over the die can be difficult in both two-dimensional and three-dimensional space. The extra time involved in solving routing issues can increase cost of the overall design. Additional traces can decrease reliability as the chances for open or shorted metallization increases. Additionally, use of the first type of die in EDS may adversely affect performance in that thermal and/or electrical requirements of the EDS may not be met due, at least in part, to the circuitous routing of traces. For example, long routes of metallization may make it difficult to remove heat from a die within the EDS. Additionally, long routes of metallization make it more likely that unwanted electromagnetic energy can couple into the metallization and thereby gain access to internal circuitry of the die, interfering with the operation of the die.

A second type of die may have access to at least some input/output/ground/power pads on a backside surface of the die. Access to pads from the backside surface is achieved by use of through substrate vias (TSVs) (also known as through silicon vias) in the die. TSVs can interconnect a topside pad to a backside pad. A TSV may be conceptualized as a vertical electrical connection between two electrical nodes in the die. In the case of a die having two opposing exterior surfaces, a first node may be on a first (e.g., topside) surface of the die while the second node may be on a second (e.g., backside) surface of the die. In such a case, the TSV may pass completely through the die.

The TSVs of die are formed during die fabrication at a foundry. As used herein, the term "foundry" refers to a semiconductor fabrication facility or a place that manufactures semiconductor integrated circuits. The fabrication of TSVs in a die at a foundry increases the cost of the die at least due to an increased die mask count and increase in a number of operations used to fabricate the die with TSVs. Integration of TSVs into a die at a foundry may also involve costs associated with yield. Some of the TSVs produced at the foundry may not be fabricated properly. For example, there may be an open circuit within the TSV such that a first node on a first side of the die will not be connected to a second node on a second side of the die. Due to errors associated with TSVs fabricated at the foundry, yield may fall and cost may rise.

Use of the second type of die (i.e., dies with TSVs) in an EDS results in a high cost of the die due to the incorporation of the TSV in the die (i.e., dies fabricated with TSVs are costlier than dies fabricated without TSVs). Additional cost is involved in that dies fabricated with TSVs use metallic plating on both the topside and backside pads of the die, to act as laser stops during EDS integration. Additionally, in connection with TSVs formed of gold, thermal conduction associated with gold TSVs is not as good as the thermal conduction offered by copper. Therefore, thermal dissipation ground resistance in EDS using dies with TSVs is not as low as desired.

Exemplary Embedded Die Substrate (EDS)

FIG. 1 illustrates a cross-sectional view of an example of an embedded die substrate (EDS) 100 implementing a first type of die 124 (e.g., a die without TSVs) according to one approach. The EDS 100 can include a core substrate 102 including a central conductive layer 104, a topside dielectric layer 106, and a backside dielectric layer 108.

A cavity 122 to hold a die 124 can be formed in the topside dielectric layer 106 and the central conductive layer 104. The bottom of the cavity 122 may be referred to as the "floor" of the cavity 122. The die 124 may be coupled to the floor of the cavity 122 (e.g., coupled to the backside dielectric layer 108 within the cavity 122). The cavity 122 may be filled with a filler-material 138.

The die 124 may include a plurality of conductive pads 128, 130, 132, 134 including a first conductive pad 128, a second conductive pad 130, a third conductive pad 132, and a fourth conductive pad 134 on a topside surface of the die 124. The die 124 of FIG. 1 does not include TSVs (e.g., vias formed within the body of the die at a foundry during die fabrication). A protective conductive layer 136 may be provided on each of the plurality of conductive pads 128, 130, 132, 134.

A topside laminate layer 140 may be provided to the topside dielectric layer 106. A backside laminate layer 142 may be provided to the backside dielectric layer 108.

In the exemplary illustration of FIG. 1, one of the plurality of conductive pads 128, 130, 132, 134 on the topside of the die 124 may be connected to a node (e.g., a conductive pad or trace) at a layer of the EDS 100 below the die 124. An exemplary routing path 144 (for electrical and thermal energy) between the second conductive pad 130 and a node 146, on a backside of the backside laminate layer 142, is illustrated with a double-sided arrow.

Topside drilling may be used to reach the second conductive pad 130 of the die 124 on the topside of the die 124. The topside drilling may extend through the topside laminate layer 140 and the filler-material 138 used to fill the cavity 122. A laser drill may be used for topside drilling. For purposes of a laser stop, the protective conductive layer 136 protects the second conductive pad 130 of the die 124. The laser stop (e.g., protective conductive layer 136) stops the laser drill from penetrating through the second conductive pad 130 and into the die 124. Backside drilling may open a path from the node 146 (e.g., a pad or a trace) toward the central conductive layer 104 of the core substrate 102.

To achieve a conductive path between the second conductive pad 130 and the node 146 (e.g., a pad or a trace), metallization can be routed up and around the die 124. Metallization can be routed up through interconnect 112 (through the topside laminate layer 140). The metallization can then be routed laterally past the edge of the die 124, along a portion of an interconnect formed by conductive trace 148. The metallization can then be routed down past the die through multiple vertical segments (e.g., segments substantially aligned along the Z-axis) of vias and pads. For example, the metallization can be routed through a first via segment 152, a first pad 154, a second via segment 156, a third via segment 158, a second pad 160, and a fourth via segment 162 before joining the node 146 of the backside laminate layer 142. Any two or more coupled via segments may be referred to herein as a "segmented interconnect." The circuitous routing of metallization just described may be difficult to plan and implement. The circuitous routing may add cost to the fabrication of the EDS 100 and may result in the EDS 100 not meeting electrical and/or thermal requirements.

Figure 2:
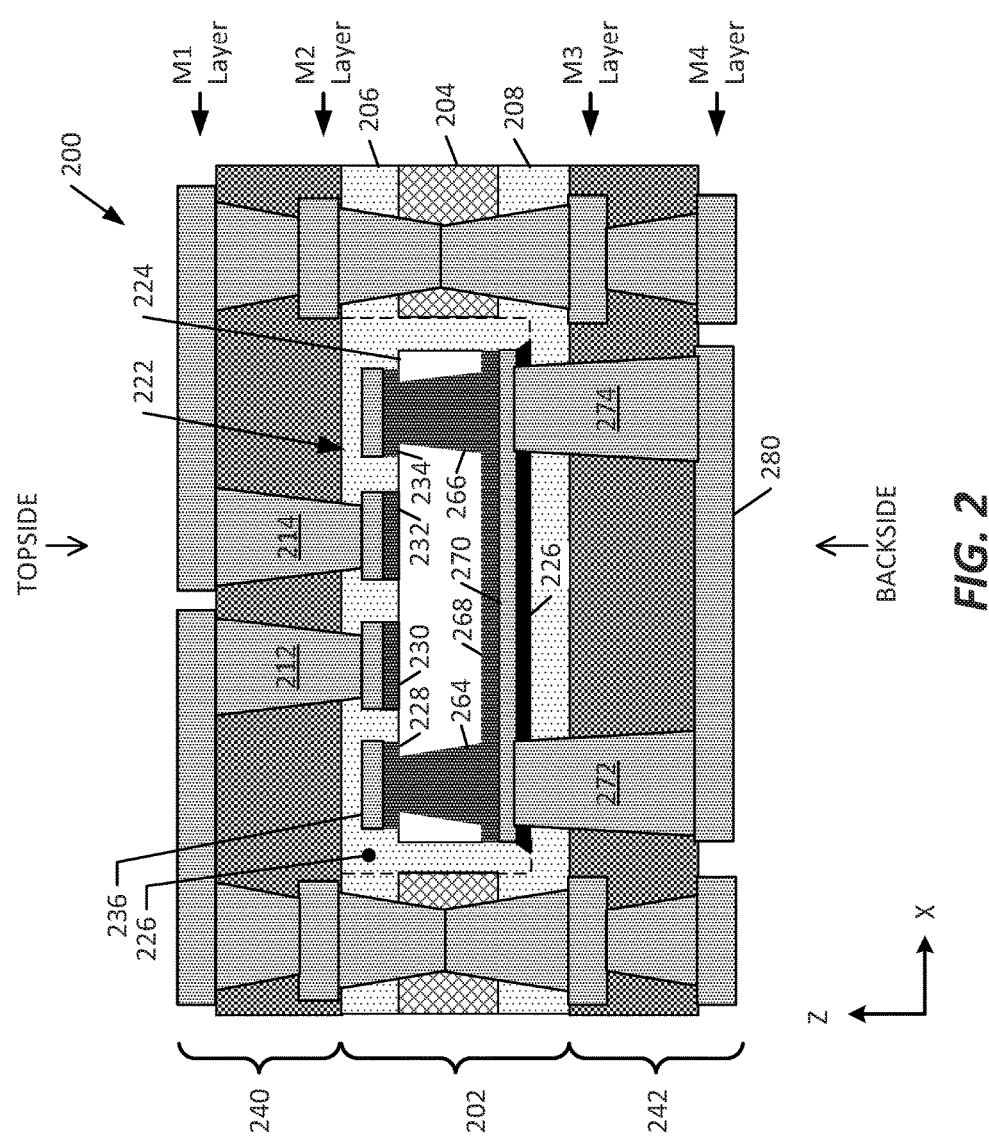
FIG. 2 illustrates a cross-sectional view of an example of an EDS implementing a second type of die according to another approach.

FIG. 2 illustrates a cross-sectional view of an example of an EDS 200 implementing a second type of die 224 (e.g., a die with TSVs) according to another approach. The EDS 200 can include a core substrate 202, including a central conductive layer 204, a topside dielectric layer 206, and a backside dielectric layer 208.

A cavity 222 to hold a die 224 can be formed in the topside dielectric layer 206 and the central conductive layer 204. The bottom of the cavity 222 may be referred to as the "floor" of the cavity 222. The die 224 may be coupled to the floor of the cavity 222 (e.g., coupled to the backside dielectric layer 208 within the cavity 222). The cavity 222 may be filled with a filler-material 238.

The die 224 may include a plurality of conductive pads 228, 230, 232, 234 including a first conductive pad 228, a second conductive pad 230, a third conductive pad 232, and a fourth conductive pad 234 on a topside surface of the die 224. The die 224 of FIG. 2 includes a first through substrate via (TSV) 264 and a second TSV 266. The first TSV 264 and the second TSV 266 can be vias formed within the body of the die 224 at a foundry during die fabrication. A topside protective conductive layer 236 may be provided on each of the plurality of conductive pads 228, 230, 232, 234.

A topside laminate layer 240 may be provided to the topside dielectric layer 206. A backside laminate layer 242 may be provided to the backside dielectric layer 208.

In the exemplary illustration of FIG. 2, the die 224 is fabricated at a foundry with the first conductive pad 228 coupled to the first TSV 264 and the fourth conductive pad 234 coupled to the second TSV 266. The first TSV 264 and the second TSV 266 are coupled to a backside conductive pad 268. That is, the die 224 includes the first TSV 264 and the second TSV 266 within the body of the die 224; the first TSV 264 and the second TSV 266 were formed within the body of the die 224 during die fabrication at the foundry. In such a configuration, the first conductive pad 228, first TSV 264, fourth conductive pad 234, second TSV 266, and backside conductive pad 268 may be formed of gold.

For purposes of a laser stop on a topside of the die 224, a topside protective conductive layer 236 protects the plurality of conductive pads 228, 230, 232, 234. For example, in a topside drilling process, the laser stop (e.g., topside protective conductive layer 236) stops a laser drill from penetrating through the second conductive pad 230 and into the die 224.

For purposes of laser stop of the backside of the die 224, a backside protective conductive layer 270 protects the backside conductive pad 268. The addition of backside protective conductive layer 270 to the die 224 adds cost to the die 224. The backside protective conductive layer 270 acts as a laser stop for holes formed by laser drilling from the backside of the EDS 200 toward the central conductive layer 204 of the core substrate 202.

The interconnects 272, 274, which may be formed during a backside drilling process during EDS integration, do not extend into and/or through the die 224. They stop at the backside protective conductive layer 270 (the laser stop layer) formed on the backside conductive pad 268 because, for example, of a concern that drilling holes (e.g., holes that extend into and/or through the die, holes that penetrate the die) into the die 224 during EDS integration can damage the die 224. It is desirable to not damage the die 224 during EDS integration because, for example, replacement of the die 224 during EDS integration may not be possible. The result of a damaged die can be complete loss of the EDS 200.

The use of the second approach to an EDS 200 may come with a cost. Die with TSV are costlier than die without TSV. Moreover, as stated above, the first TSV 264 and the second TSV 266 may be formed of gold. In contrast, the interconnects 272, 274 may be formed of copper. The thermal conductivity of gold is less than that of copper. Accordingly, the transfer of thermal energy from the die 224 to, for example, a pad or trace 280 on the backside of the backside laminate layer 242 is not optimal.

In contrast to the exemplary approaches illustrated in FIG. 1 and FIG. 2, an exemplary EDS having at least one single-segment die-penetrating interconnect formed in a die by backside drilling into the die during EDS integration (not at the foundry) may save cost by reducing foundry TSV costs, may reduce backside copper plating costs for backside drilling, and may improve performance by using an single-segment die penetrating interconnect formed entirely of a conductor such as copper, which has better thermal conductivity than gold.

Improved Exemplary Embedded Die Substrate (EDS)

Figure 3:
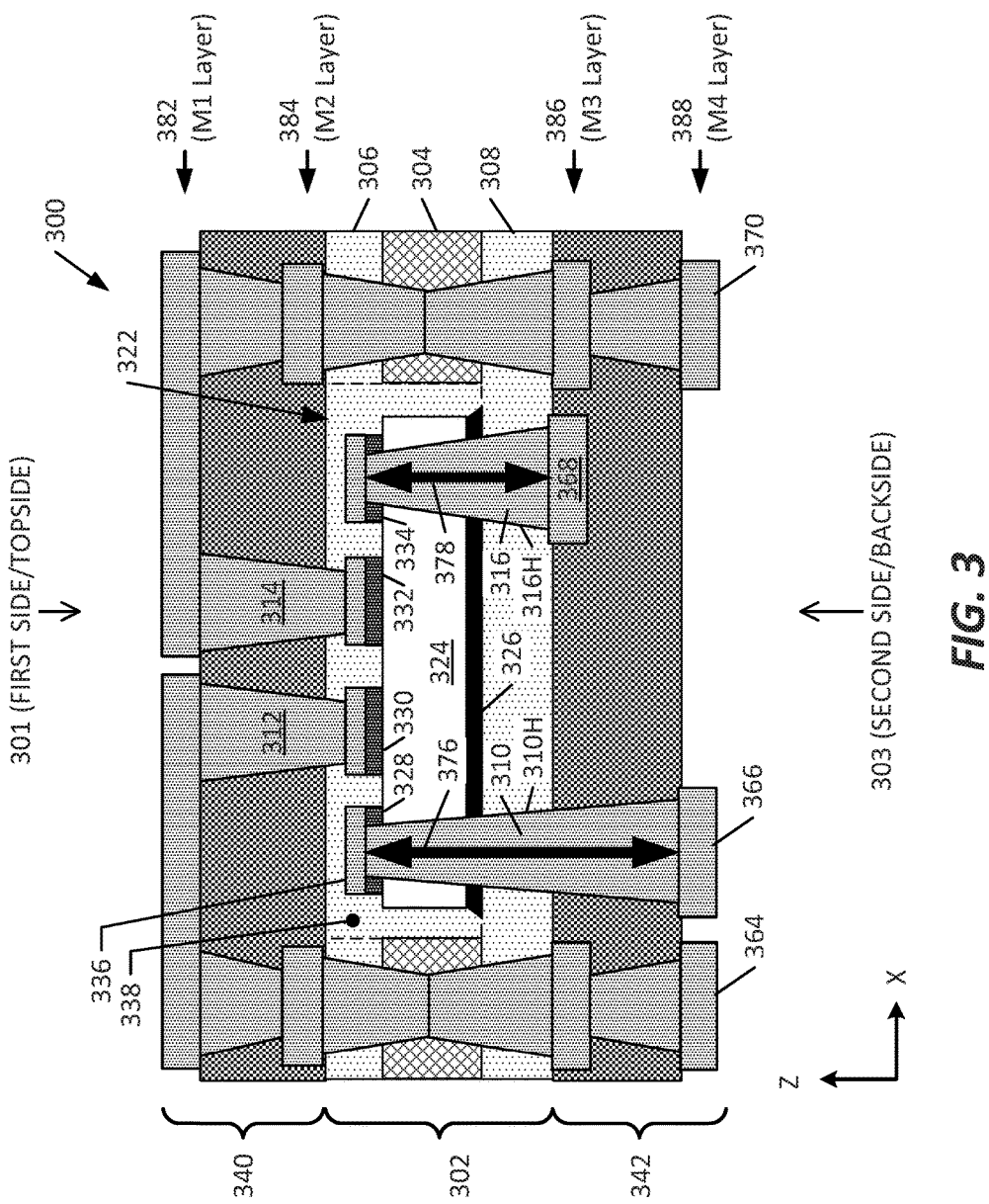
FIG. 3 illustrates a cross-sectional view of an EDS including a single-segment die-penetrating first interconnect and a single-segment die-penetrating second interconnect according to aspects described herein.

FIG. 3 illustrates a cross-sectional view of an EDS 300 including a single-segment die-penetrating first interconnect 310 and a single-segment die-penetrating fourth interconnect 316 according to aspects described herein.

The term "single-segment" structure may be used herein to describe a unitary structure, an indivisible structure, and/or an undivided structure. As used herein, the term "single-segment die-penetrating interconnect" may be used herein to describe a unitary, indivisible, and/or undivided interconnect where a portion of the interconnect extends through (e.g., penetrates, pierces, passes into, passes through, enters) at least a portion of one layer (e.g., a substrate layer, a dielectric layer, a laminate layer) of an EDS 300 and a die 324 of the EDS 300. An example of a single-segment die-penetrating interconnect may include a columnar structure having a sidewall with a defined non-zero height, a plated hole, and/or a filled hole formed from one conductive material having a first end (e.g., a first end at and/or in a second laminate layer 342 (e.g., a backside laminate layer) or a second dielectric layer 308) and a distal second end (e.g., a terminus of the first end, a second end at and/or in a first conductive pad 328 of the die 324 of the EDS 300, or at and/or in a protective conductive layer 336 (e.g., a laser stop, a metal layer, a copper layer) provided on the first conductive pad 328). As used herein, a single-segment die-penetrating interconnect (e.g., single-segment die-penetrating first interconnect 310) may be formed, for example, by drilling a first hole 310H through a substrate 302 of the EDS 300, into the die 324 of the EDS 300, and into a conductive pad 328 of the die 324 and plating and/or filling the first hole 310H with one conductive material that couples to the conductive pad 328 from within the first hole 310H. The conductive material may plate the sidewalls of the first hole 310H and/or fill the first hole 310H completely. In some implementations, the first hole 310H may have a constant diameter or a linearly decreasing diameter (e.g., drilling the hole is implemented such that the hole has a constant diameter or a linearly decreasing diameter along the entire length of the hole).

In some implementations, a formation of layers (e.g., electrically conductive layers comprising a plurality of segments) would not be detected in a cross-sectional analysis or a parallel lapping (p-lapping) of a single-segment die-penetrating interconnect in the EDS 300. In some implementations, a single-segment die-penetrating interconnect according to aspects described herein includes only one segment (e.g., layer), in contrast, for example, to a stack of a plurality of joined (e.g., abutted) vias.

The single-segment die-penetrating first interconnect 310 may be plated and/or filled along its entire length with a conductive material. In some implementations, only one conductive material is used. In other words, in some implementations, the one conductive material is distributed along an entire length of the single-segment die-penetrating first interconnect 310. The one conductive material may form a unitary, indivisible, and/or undivided structure. In some implementations, the conductive material may be copper. In some implementations, the conductive material may be a conductive paste. The single-segment die-penetrating first interconnect 310 may be formed during a backside drilling process of the EDS 300, after the die 324 is coupled (e.g., physically mounted) to the substrate 302. In some implementations, the die 324 used in the EDS 300 may be produced at a foundry without a TSV at a location predesignated for the single-segment die-penetrating first interconnect 310.

The EDS 300 may include a substrate 302. The substrate 302 may have a first side 301 and an opposite second side 303. The substrate 302 may be a core substrate. The substrate 302 may include a conductive layer 304 sandwiched between a first dielectric layer 306 at the first side 301 of the substrate 302 and a second dielectric layer 308 at the second side 303 of the substrate 302. The conductive layer 304 may be formed of a metal such as copper. The conductive layer 304 may be thicker than other conductive layers (e.g., M1 layer 382, M2 layer 384, M3 layer 386, M4 layer 388) in the EDS 300. The thickness of the conductive layer 304 may provide rigidity and/or structural support to the EDS 300. The conductive layer 304 may be used as a ground plane or a power plane of the EDS 300.

In an alternative aspect, the substrate 302 may be a core substrate. In the alternative aspect, it is contemplated that the substrate 302 may include a dielectric layer (not shown) sandwiched between a first conductive layer (not shown) at the first side 301 of the substrate 302 and a second conductive layer (not shown) at the second side 303 of the substrate 302. In other words, in the alternative aspect, the substrate 302 may have a non-conductive dielectric layer that is clad on opposite sides with conductive layers. Appropriate insulators may be formed around interconnects extending through the various layers to prevent shorting to the conductive layers on either side of the dielectric.

A cavity 322 may be defined within the substrate 302. As described herein, the cavity 322 may be an opening or void defined by sidewalls within the substrate 302. The cavity 322 may be defined within the substrate 302 from the first side 301 of the substrate 302. The cavity 322 may be formed in the substrate. The cavity 322 may be large enough to hold the die 324. The cavity 322 may be formed by methods including, for example, photolithographic, mechanical, and/or laser drilling. The bottom of the cavity 322 may be referred to as the "floor" of the cavity 322. In some implementations, the cavity 322 may be devoid of the first dielectric layer 306 and the conductive layer 304, and the floor of the cavity 322 may be defined by the second dielectric layer 308 exposed in the cavity 322.

The die 324 may include active and/or passive circuits/components. The die 324 may be coupled to the floor of the cavity 322 (e.g., coupled to the second dielectric layer 308 within the cavity 322) using a surface mount technology (SMT) component placement system, commonly described as a pick-and-place machine, a die bonding machine, or a chip shooter. The die 324 may be coupled to the floor of the cavity 322, for example, using an adhesive, solder, or epoxy 326.

The die 324 may include a plurality of conductive pads 328, 330, 332, 334 including a first conductive pad 328, a second conductive pad 330, a third conductive pad 332, and a fourth conductive pad 334 on a side of the die 324 distal to the floor of the cavity 322. The die 324 of the exemplary illustration in FIG. 3 does not depict through substrate vias (TSVs) that were formed within the die 324 at a foundry during fabrication of the die 324. In some implementations, the die 324 may include one or more TSVs formed within the die 324 at a foundry during die fabrication, but not in a location predesignated for a single-segment die-penetrating interconnect such as the single-segment die-penetrating first interconnect 310 and the single-segment die-penetrating fourth interconnect 316.

The plurality of conductive pads 328, 330, 332, 334 may be formed of any conductive material (e.g., gold). A protective conductive layer 336 may be printed, deposited, formed, or otherwise provided on each of the plurality of conductive pads 328, 330, 332, 334. The protective conductive layer 336 may be used as a laser stop in case that laser drilling is used in the formation of portions of the single-segment die-penetrating first interconnect 310, the second interconnect 312, the third interconnect 314, and/or the single-segment die-penetrating fourth interconnect 316.

The cavity 322 may be filled with a filler-material 338 to encapsulate, protect, and/or immobilize the die 324. The filler-material 338 may be, for example, an encapsulation material, the material used to form the first dielectric layer 306, or a pre-preg material such as the pre-preg material laminated to a topside surface of the first dielectric layer 306.

A first laminate layer 340 (e.g., a topside laminate layer) may be provided to the first dielectric layer 306. A second laminate layer 342 (e.g., a backside laminate layer) may be provided to the second dielectric layer 308. Each of the first laminate layer 340 and second laminate layer 342 may be referred to as a pre-preg (pre-impregnated) layer. Each of the first laminate layer 340 and second laminate layer 342 may include one or more dielectric and electrically conductive layers. The pre-preg layers, for example, may be provided by depositing the layers onto their respective surfaces by spraying. Other ways to provide pre-preg layers and/or additional layers onto the substrate 302 (e.g., laminating, bonding, attaching, adhering, forming) are known to those of skill in the art.

In the exemplary illustration of FIG. 3, the die 324 may be fabricated at a foundry without TSVs at the locations pre-designated for the single-segment die-penetrating first interconnect 310 and the single-segment die-penetrating fourth interconnect 316. TSVs at other locations are optional. Reducing the number of TSVs in a given die may reduce the cost of the die. Instead of forming TSVs at the locations pre-designated for the single-segment die-penetrating first interconnect 310 and the single-segment die-penetrating fourth interconnect 316 during die fabrication at a foundry, the single-segment die-penetrating first interconnect 310 and the single-segment die-penetrating fourth interconnect 316 may be formed during EDS integration by backside drilling through at least a portion of the substrate 302 and the die 324.

First conductive pad 328 and fourth conductive pad 334 (which can couple, respectively, to the single-segment die-penetrating first interconnect 310 and the single-segment die-penetrating fourth interconnect 316) may be coupled to active and/or passive circuits of the die 324. Likewise, second conductive pad 330 and third conductive pad 332 may be coupled to active and/or passive circuits of the die 324.

In connection with a topside drilling process associated with second interconnect 312 and third interconnect 314, the laser stop (e.g., protective conductive layer 336) stops a hole formed by a laser drill from penetrating through the conductive pads 330, 332 (which may be formed of gold) and into the die 324. Second interconnect 312 and third interconnect 314 do not extend into and/or through the die 324.

In connection with the backside drilling process, the single-segment die-penetrating first interconnect 310 and the single-segment die-penetrating fourth interconnect 316 may extend into and/or through the die 324. In other words, the single-segment die-penetrating first interconnect 310 and the single-segment die-penetrating fourth interconnect 316 may be formed in a first hole 310H and a fourth hole 316H, respectively, by drilling through the second laminate layer 342 (if appropriate), the second dielectric layer 308 (e.g., the floor of the cavity 322 formed in the substrate 302), and into and/or through the die 324 coupled to the floor of the cavity 322.

It is noted that, in connection with a backside drilling process associated with the single-segment die-penetrating first interconnect 310 and the single-segment die-penetrating fourth interconnect 316, a laser stop on the backside of the die 324 is not present. Indeed, a laser stop could frustrate the formation of the single-segment die-penetrating first interconnect 310 and the single-segment die-penetrating fourth interconnect 316 during a backside drilling process implemented with a laser drill. Elimination of the laser stop, at least at locations predesignated for the formation of single-segment die-penetrating interconnects, may save cost.

In the exemplary illustration of FIG. 3, one or more of the second conductive pad 330 and third conductive pad 332 on the topside of the die 324 may be connected to a first node 364 and a fourth node 370 (e.g., a conductive pad or trace) at a layer of the EDS 300 below the die 324. An example of a routing path to accomplish such a connection was provided above in connection with FIG. 1 and will not be repeated for conciseness.

Benefits of implementing the single-segment die-penetrating first interconnect 310 may include provision of a conduction path 376 through one conductive material (e.g., copper) from the first conductive pad 328 (or protective conductive layer 336 on the first conductive pad 328) to an M4 layer 388 pad or trace 366 on the second laminate layer 342. The conduction path 376 can pass through the die 324 and the portion of the substrate 302 between the die 324 and the second laminate layer 342. Because the single-segment die-penetrating first interconnect 310 can be made of one conducting material, the conducting material can be selected to minimize the thermal dissipation ground resistance and maximize thermal conductivity. The conduction path 376 is graphically illustrated in FIG. 3 by a double sided arrow.

Benefits of implementing the single-segment die-penetrating fourth interconnect 316 illustrated in FIG. 3 may include a conduction path 378 from the fourth conductive pad 334 (or protective conductive layer 336 on the fourth conductive pad 334) to a third node 368 (e.g., an M3 layer 386 third node 368 (e.g., pad, trace)) on the second dielectric layer 308. The conduction path 378 can pass through the die 324 and the portion of the substrate 302 between the die 324 and the second laminate layer 342. Because the single-segment die-penetrating fourth interconnect 316 can be made of one conducting material, the conducting material can be selected to minimize the thermal dissipation ground resistance and maximize thermal conductivity. The conduction path 378 is graphically illustrated in FIG. 3 by a double sided arrow.

Implementing structures and methods described herein can result in a minimization of the thermal dissipation ground resistance and maximization of thermal conductivity of the conduction paths (e.g., conduction path 376) between, for example, first conductive pad 328 and backside pad or trace 366. For example, using a single-segment die-penetrating first interconnect 310 formed of copper can result in an improvement in thermal conductivity of approximately 30 percent over a gold TSV via segment stacked on a copper plated via segment (e.g., as in the example described in connection with FIG. 2).

In summary, according to one aspect, a device such as an EDS 300 may include a substrate 302 having a first side 301 and an opposite second side 303, a cavity 322 defined within the substrate 302 from the first side 301, a die 324 coupled to a floor of the cavity 322, the die 324 having a conductive pad (e.g., fourth conductive pad 334) on a side of the die 324 distal to the floor of the cavity 322. The EDS 300 may further include a hole (e.g., fourth hole 316H) extending through and defined within the second side 303 (e.g., within the second dielectric layer 308) of the substrate 302, the die 324, and the conductive pad (e.g., fourth conductive pad 334). The EDS 300 may further include a conductive material (e.g., single-segment die-penetrating fourth interconnect 316) within the hole (e.g., fourth hole 316H) and extending between and through the second side 303 (e.g., within the second dielectric layer 308) of the substrate 302 and the conductive pad (e.g., fourth conductive pad 334). In other words, in some implementations of the EDS 300 of FIG. 3, the hole (e.g., fourth hole 316H) may be continuous through the second side 303 (e.g., within the second dielectric layer 308) of the substrate 302, the die 324, and the conductive pad (e.g., fourth conductive pad 334). In some implementations, the hole (e.g., fourth hole 316H) may be concentric along a linear axis extending through the second side 303 (e.g., within the second dielectric layer 308) of the substrate 302, the die 324, and the conductive pad (e.g., fourth conductive pad 334). In some implementations, the hole (e.g., fourth hole 316H) may be a single linear hole along a length of the hole (e.g., fourth hole 316H). In some implementations, the conductive material (e.g., that forms the single-segment die-penetrating fourth interconnect 316) may be a unitary single-segment. In some implementations, the conductive material (e.g., that forms the single-segment die-penetrating fourth interconnect 316) may include only one layer. In other words, the conductive material plated and/or filled into the hole (e.g., fourth hole 316H) may be identified as a single-segment die-penetrating interconnect (e.g., single-segment die-penetrating fourth interconnect 316).

In summary, according to one aspect, a device such as an EDS 300 may include a substrate 302 having a first side 301 and an opposite second side 303, a cavity 322 defined within the substrate 302 from the first side 301, a die 324 coupled to a floor of the cavity 322, the die 324 having a conductive pad (e.g., first conductive pad 328) on a side of the die 324 distal to the floor of the cavity 322. The EDS 300 may further include a laminate layer (e.g., second laminate layer 342) coupled to the second side 303 (e.g., second dielectric layer 308) of the substrate 302, adjacent to the floor of the cavity 322. In some aspects, the second side 303 (e.g., second dielectric layer 308) of the substrate 302 may be sandwiched between the die 324 and the laminate layer (e.g., second laminate layer 342). The EDS 300 may further include a hole (e.g., first hole 310H) extending through and defined within laminate layer (e.g., second laminate layer 342), the second side 303 (e.g., second dielectric layer 308) of the substrate 302, the die 324, and the conductive pad (e.g. first conductive pad 328). The EDS 300 may further include a conductive material (e.g., single-segment die-penetrating first interconnect 310) within the hole (e.g., first hole 310H) and extending between and through the laminate layer (e.g., second laminate layer 342), the second side 303 (e.g., second dielectric layer 308) of the substrate 302, the die 324, and the conductive pad (e.g. first conductive pad 328). In some implementations, the hole (e.g., first hole 310H) may be continuous through the laminate layer (e.g., second laminate layer 342), the second side 303 (e.g., second dielectric layer 308) of the substrate 302, the die 324, and the conductive pad (e.g. first conductive pad 328). In some implementations, the hole (e.g., first hole 310H) may be concentric along a linear axis extending through the laminate layer (e.g., second laminate layer 342), the second side 303 (e.g., second dielectric layer 308) of the substrate 302, the die 324, and the conductive pad (e.g. first conductive pad 328). In some implementations, the hole (e.g., first hole 310H) may be a single linear hole along a length of the hole (e.g., first hole 310H). In some implementations, the conductive material (e.g., that forms the single-segment die-penetrating first interconnect 310) may be a unitary single-segment. In some implementations, the conductive material (e.g., that forms the single-segment die-penetrating first interconnect 310) may include only one layer. In other words, the conductive material plated and/or filled into the hole (e.g., first hole 310H) may be identified as a single-segment die-penetrating interconnect (e.g., single-segment die-penetrating first interconnect 310).

Appropriate insulators may be formed around interconnects extending through the various layers to prevent shorting, for example, to the conductive layer 304 and/or adhesive, solder, or epoxy 326.

Figure 4:
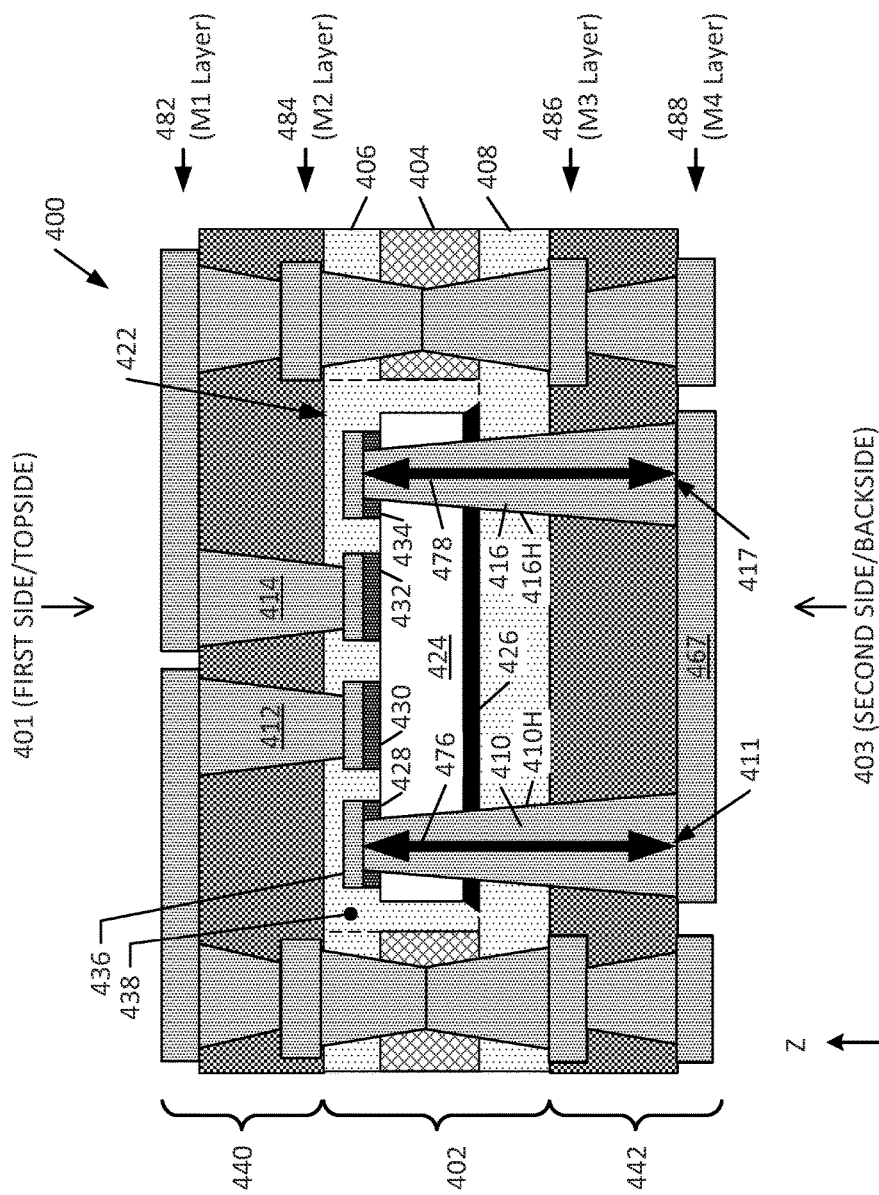
FIG. 4 illustrates a cross-sectional view of another EDS including a single-segment die-penetrating first interconnect and a single-segment die-penetrating second interconnect according to aspects described herein.

FIG. 4 illustrates a cross-sectional view of an EDS 400 including a single-segment die-penetrating first interconnect 410 and a single-segment die-penetrating fourth interconnect 416 according to aspects described herein. A difference between the EDS 300 of FIG. 3 and the EDS 400 of FIG. 4 is that all single-segment die-penetrating interconnects have first ends 411, 417 at the same layer (e.g., M4 layer 488). Accordingly, in the aspect of FIG. 4, the single-segment die-penetrating interconnects (410, 416) may be formed during a single backside drilling process.

The EDS 400 may include a substrate 402. The substrate 402 may have a first side 401 and an opposite second side 403. The substrate 402 may be a core substrate. The substrate 402 may include a conductive layer 404 sandwiched between a first dielectric layer 406 at the first side 401 of the substrate 402 and a second dielectric layer 408 at the second side 403 of the substrate 402. The conductive layer 404 may be formed of a metal such as copper. The conductive layer 404 may be thicker than other conductive layers (e.g., M1 layer 482, M2 layer 484, M3 layer 486, M4 layer 488) in the EDS 400. The thickness of the conductive layer 404 may provide rigidity and/or structural support to the EDS 400. The conductive layer 404 may be used as a ground plane or a power plane of the EDS 400.

In an alternative aspect, the substrate 402 may be a core substrate. In the alternative aspect, it is contemplated that the substrate 402 may include a dielectric layer (not shown) sandwiched between a first conductive layer (not shown) at the first side 401 of the substrate 402 and a second conductive layer (not shown) at the second side 403 of the substrate 402. In other words, in the alternative aspect, the substrate 402 may have a non-conductive dielectric layer that is clad on opposite sides with conductive layers. Appropriate insulators may be formed around interconnects extending through the various layers to prevent shorting, for example, to conductive layers on either side of the dielectric.

A cavity 422 may be defined within the substrate 402. As described herein, the cavity 422 may be an opening or void defined by sidewalls within the substrate 402. The cavity 422 may be defined within the substrate 402 from the first side 401 of the substrate 402. The cavity 422 may be formed in the substrate. The cavity 422 may be large enough to hold the die 424. The cavity 422 may be formed by methods including, for example, photolithographic, mechanical, and/or laser drilling. The bottom of the cavity 422 may be referred to as the "floor" of the cavity 422. In some implementations, the cavity 422 may be devoid of the first dielectric layer 406 and the conductive layer 404, and the floor of the cavity 422 may be defined by the second dielectric layer 408 exposed in the cavity 422.

The die 424 may include active and/or passive circuits/components. The die 424 may be coupled to the floor of the cavity 422 (e.g., coupled to the second dielectric layer 408 within the cavity 422) using a surface mount technology (SMT) component placement system, commonly described as a pick-and-place machine, a die bonding machine, or a chip shooter. The die 424 may be coupled to the floor of the cavity 422, for example, using an adhesive, solder, or epoxy 426.

The die 424 may include a plurality of conductive pads 428, 430, 432, 434 including a first conductive pad 428, a second conductive pad 430, a third conductive pad 432, and a fourth conductive pad 434 on a side of the die 424 distal to the floor of the cavity 422. The die 424 of the exemplary illustration in FIG. 4 does not depict any through substrate vias (TSVs) that were formed within the die 424 at a foundry during fabrication of the die 424. In some implementations, the die 424 may include one or more TSVs formed within the die 424 at a foundry during die fabrication, but not in a location predesignated for a single-segment die-penetrating interconnect such as the single-segment die-penetrating first interconnect 410 and the single-segment die-penetrating fourth interconnect 416.

The plurality of conductive pads 428, 430, 432, 434 may be formed of any conductive material (e.g., gold). A protective conductive layer 436 may be printed, deposited, formed, or otherwise provided on each of the plurality of conductive pads 428, 430, 432, 434. The protective conductive layer 436 may be used as a laser stop in case that laser drilling is used in the formation of portions of the single-segment die-penetrating first interconnect 410, the second interconnect 412, the third interconnect 414, and/or the single-segment die-penetrating fourth interconnect 416.

The cavity 422 may be filled with a filler-material 438 to encapsulate, protect, and/or immobilize the die 424. The filler-material 438 may be, for example, an encapsulation material, the material used to form the first dielectric layer 406, or a pre-preg material such as the pre-preg material laminated to a topside surface of the first dielectric layer 406.

A first laminate layer 440 (e.g., a topside laminate layer) may be provided to the first dielectric layer 406. A second laminate layer 442 (e.g., a backside laminate layer) may be provided to the second dielectric layer 408. Each of the first laminate layer 440 and second laminate layer 442 may be referred to as a pre-preg (pre-impregnated) layer. Each of the first laminate layer 440 and second laminate layer 442 may include one or more dielectric and electrically conductive layers. The pre-preg layers, for example, may be provided by depositing the layers onto their respective surfaces by spraying. Other ways to provide the pre-preg layers and/or additional layers onto the substrate 402 (e.g., laminating, bonding, attaching, adhering, forming) are known to those of skill in the art.

In the exemplary illustration of FIG. 4, the die 424 can be fabricated at a foundry without TSVs at the locations pre-designated for the single-segment die-penetrating first interconnect 410 and the single-segment die-penetrating fourth interconnect 416. TSVs at other locations may be optional. Reducing the number of TSVs in a given die may reduce the cost of the die. Instead of forming TSVs at the locations pre-designated for the single-segment die-penetrating first interconnect 410 and the single-segment die-penetrating fourth interconnect 416 during die fabrication at a foundry, the single-segment die-penetrating first interconnect 410 and the single-segment die-penetrating fourth interconnect 416 may be formed during EDS integration by backside drilling through at least a portion of the substrate 402 and the die 424.

First conductive pad 428 and fourth conductive pad 434 (which can couple, respectively, to the single-segment die-penetrating first interconnect 410 and the single-segment die-penetrating fourth interconnect 416) may be coupled to active and/or passive circuits of the die 424. Likewise, second conductive pad 430 and third conductive pad 432 may be coupled to active and/or passive circuits of the die 424.

In connection with a topside drilling process associated with second interconnect 412 and third interconnect 414, the laser stop (e.g., protective conductive layer 436) stops a hole formed by a laser drill from penetrating through the conductive pads 430, 432 (which may be formed of gold) and the die 424. Second interconnect 412 and third interconnect 414 do not extend into and/or through the die 424.

In connection with the backside drilling process, the single-segment die-penetrating first interconnect 410 and the single-segment die-penetrating fourth interconnect 416 may extend into and/or through the die 424. In other words, the single-segment die-penetrating first interconnect 410 and single-segment die-penetrating fourth interconnect 416 may be formed from respective first hole 410H and fourth hole 416H by drilling through the second laminate layer 442, the second dielectric layer 408 (e.g., the floor of the cavity 422 formed in the substrate 402), and into and/or through the die 424 coupled to the floor of the cavity 422.

It is noted that, in connection with a backside drilling process associated with the single-segment die-penetrating first interconnect 410 and the single-segment die-penetrating fourth interconnect 416, a laser stop on the backside of the die 424 is not present. Indeed, a laser stop could frustrate the formation of the single-segment die-penetrating first interconnect 410 and single-segment die-penetrating fourth interconnect 416 during a backside drilling process implemented with a laser drill. Elimination of the laser stop, at least at locations predesignated for the formation of single-segment die-penetrating interconnects, may save cost.

Benefits of implementing the single-segment die-penetrating first interconnect 410 and single-segment die-penetrating fourth interconnect 416 may include provision of conduction paths 476, 478 through one conductive material (e.g., copper). The conduction path 476 associated with the single-segment die-penetrating first interconnect 410 can extend from the first conductive pad 428 (or protective conductive layer 436 on the first conductive pad 428) to an M4 layer 488 pad or trace 467 on the second laminate layer 442. The conduction path 478 associated with the single-segment die-penetrating fourth interconnect 416 can extend from the fourth conductive pad 434 (or protective conductive layer 436 on the fourth conductive pad 434) to the same M4 layer 488 pad or trace 467 on the second laminate layer 442. The conduction paths 476, 478 can pass through the die 424, the portion of the substrate 402 between the die 424 and the second laminate layer 442, and the second laminate layer 442. Because the single-segment die-penetrating first interconnect 410 and single-segment die-penetrating fourth interconnect 416 can be made of one conducting material, the conducting material can be selected to minimize the thermal dissipation ground resistance and maximize thermal conductivity. The conduction paths 476, 478 are graphically illustrated in FIG. 4 by double sided arrows.

Implementing structures and methods described herein can result in a minimization of the thermal dissipation ground resistance and maximization of thermal conductivity of the conduction paths (e.g., conduction paths 476, 478) between, for example, topside conductive pads (e.g. first conductive pad 428, fourth conductive pad 434) and pad or trace 467 on the second laminate layer 442. For example, using a single-segment die-penetrating interconnects (e.g., 410, 416) formed of copper can result in an improvement in thermal conductivity of approximately 30 percent over a gold TSV via segment stacked on a copper plated via segment (e.g., as in the example described in connection with FIG. 2).

Appropriate insulators may be formed around interconnects extending through the various layers to prevent shorting, for example, to the conductive layer 404 and/or adhesive, solder, or epoxy 426.

FIG. 5A illustrates a backside plan view of a die 524 that may be installed in an EDS according to aspects described herein. For example, the die 524 may be installed in the EDS of FIGS. 3, 4, 6A, and/or 6B. A die 524 may have an area 525, inboard of the edges of the die 524, populated with active and/or passive circuitry. The edges of the area 525 populated with active and/or passive circuitry are demarcated in FIG. 5A by a phantom dashed line. A guard area 527 between the edges of the die 524 and the edges of the area 525 populated with active and/or passive circuitry may be established. In some implementations, little if any circuitry is present in the guard are 527.

FIG. 5B illustrates a cross-sectional view of the die 524 of FIG. 5A taken along the line 5B-5B. FIG. 5B graphically illustrates that little if any circuitry is present in the guard are 527. In some implementations, single-segment die-penetrating interconnects may be located in the guard area 527. However, single-segment die-penetrating interconnects may be located anywhere on the die 524.

Figure 6A:
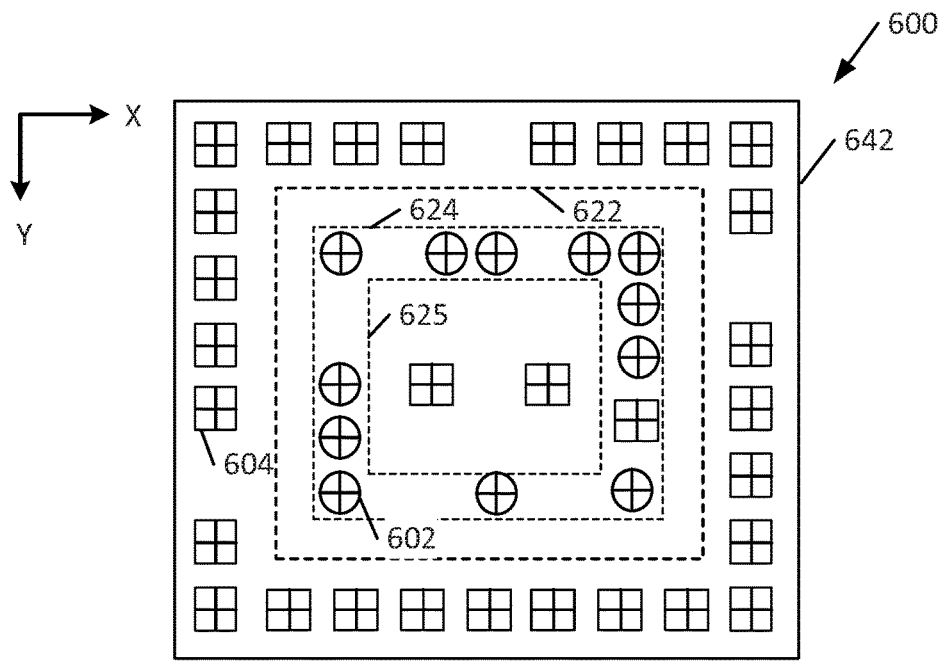
FIG. 6A illustrates a backside plan view of a first EDS having first locations pre-designated for formation of single-segment die-penetrating interconnects according to aspects described herein.

FIG. 6A illustrates a backside plan view of a first EDS 600 having first locations 602 pre-designated for formation of single-segment die-penetrating interconnects. A phantom dashed line demarcates an area 625, inboard of the edges of the die 624, populated with active and/or passive circuitry.

A "plus" symbol enclosed within a circle graphically symbolizes each of the first locations 602. The first locations 602 are located adjacent to and within a border (e.g., an edge) of the die 624. All single-segment die-penetrating interconnects formed at the designated first locations 602 may extend into and/or through the die 624. FIG. 6A additionally illustrates second locations 604 pre-designated for formation of other interconnects, which do not extend into and/or through the die 624. A "plus" symbol enclosed within a square graphically symbolizes each of the second locations 604. The second locations 604 may be located outside of a border of the die 624 or may be located within the border of the die 624.

The plan view of the first EDS 600 is presented at a stage prior to a backside drilling process. A representation of a backside surface of a second laminate layer 642, prior to addition of an electrically conductive layer (similar to M4 layer 388 of FIG. 3), is illustrated. An outline of the die 624 embedded within the first EDS 600 is presented in phantom dashed lines because, in the illustrated plan view and even with the die 624 coupled to the first EDS 600, the die 624 would not be visible from the backside of the first EDS 600. Additionally, an outline of the cavity 622 (e.g., an opening or void defined by sidewalls) within which the die 624 resides is presented in phantom dashed lines because the cavity 622 would similarly not be visible from the backside of the first EDS 600.

In some implementations, during a backside drilling process, a laser drill may form a plurality of holes by drilling a hole at each of the first locations 602. Each hole formed at each of the first locations 602 may extend into and/or through the second laminate layer 642, a floor of the cavity 622, the die 624, and a conductive pad (not shown) on a topside of the die 624 (and may further expose an underside surface of a laser stop layer (not shown) associated with the conductive pad (not shown) on the topside of the die 624).

In some implementations, during the backside drilling process, the laser drill may form a plurality of holes by drilling a hole at each of the second locations 604. Each hole formed at each of the second locations 604 does not extend into and/or through the die 624.

In some implementations, after holes are drilled at each of the first locations 602 and second locations 604, a conductive material may be used to plate and/or fill the holes thus forming interconnects within the holes. The conductive material may plate the sidewalls of the holes and/or fill the holes completely. The plating and/or filling of the holes with the conductive material may couple edges of metallization exposed on sidewalls of the holes (and/or at each of the first locations 602, the conductive pad (not shown) and/or laser stop (not shown) on a topside of the die 624) and the remainder of the interconnect. Additional metallization to form, for example, pads and traces of an M4 layer, may be added to the second laminate layer 642.

In FIG. 6A, the first locations 602 pre-designated for formation of single-segment die-penetrating interconnects are illustrated as being located toward the outer edge of the die 624. The area around the outer edge of the die may be referred to as the guard area (e.g., 527, FIG. 5). The guard area may have less density, in terms of active and/or passive circuitry on or within the die 624 than the area 625 inboard of the edges of the die. In some implementations, the die 624 may be designed to be forgiving of misalignment of a drill (e.g., a laser drill) with the first locations 602. In some implementations, the drill tasked with drilling holes for single-segment die-penetrating interconnects may be a laser drill, capable of drilling holes of diameters between about 10 and 200 urn or between about 30 and 100 um; however, diameters smaller or larger than the range provided are acceptable and are contemplated. As known to those of skill in the art, for example, the diameter of the holes may depend on the thickness of the die. In some implementations, the die may range in size on the order of about 1.5×1.5 mm to about 10×10 mm; in one implementation the die may be about 2×2 mm; however, the die are not limited to the dimensions recited herein and may be larger or smaller depending on, for example, package size.

Figure 6B:
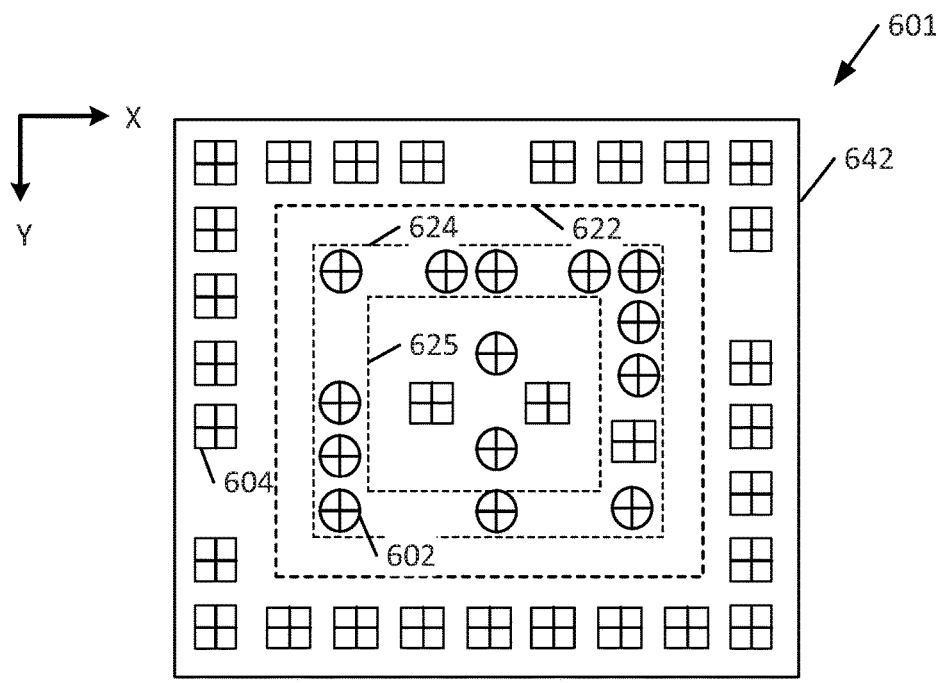
FIG. 6B illustrates a backside plan view of a second EDS having first locations pre-designated for formation of single-segment die-penetrating interconnects according to aspects described herein.

FIG. 6B illustrates a backside plan view of a second EDS 601 having first locations 602 pre-designated for formation of single-segment die-penetrating interconnects. A phantom dashed line demarcates an area 625, inboard of the edges of the die 624, which is populated with active and/or passive circuitry. The description of the components of FIG. 6B are the same or similar to the components of FIG. 6A and will not be repeated for conciseness. In FIG. 6B, however, the first locations 602 pre-designated for formation of single-segment die-penetrating interconnects are illustrated as being located adjacent to the die 624, and both on the outer edge of the die 624 (e.g., in the guard area of the die) and within the area 625 inboard of the edges of the die 624 (e.g., an area with a high density of active and/or passive circuitry). The aspect of FIG. 6B is meant to illustrate that even though the density of active and/or passive circuitry on or within the die 624 may be greater within the area 625 inboard of the edges of the die 624 than in the area adjacent to the edges of the die 624, it is possible to design a die 624 to accommodate single-segment die-penetrating interconnects within the area 625 inboard of the edges of the die 624.

Exemplary Sequence for Fabricating an Embedded Die Substrate (EDS) Device

Figure 7A:
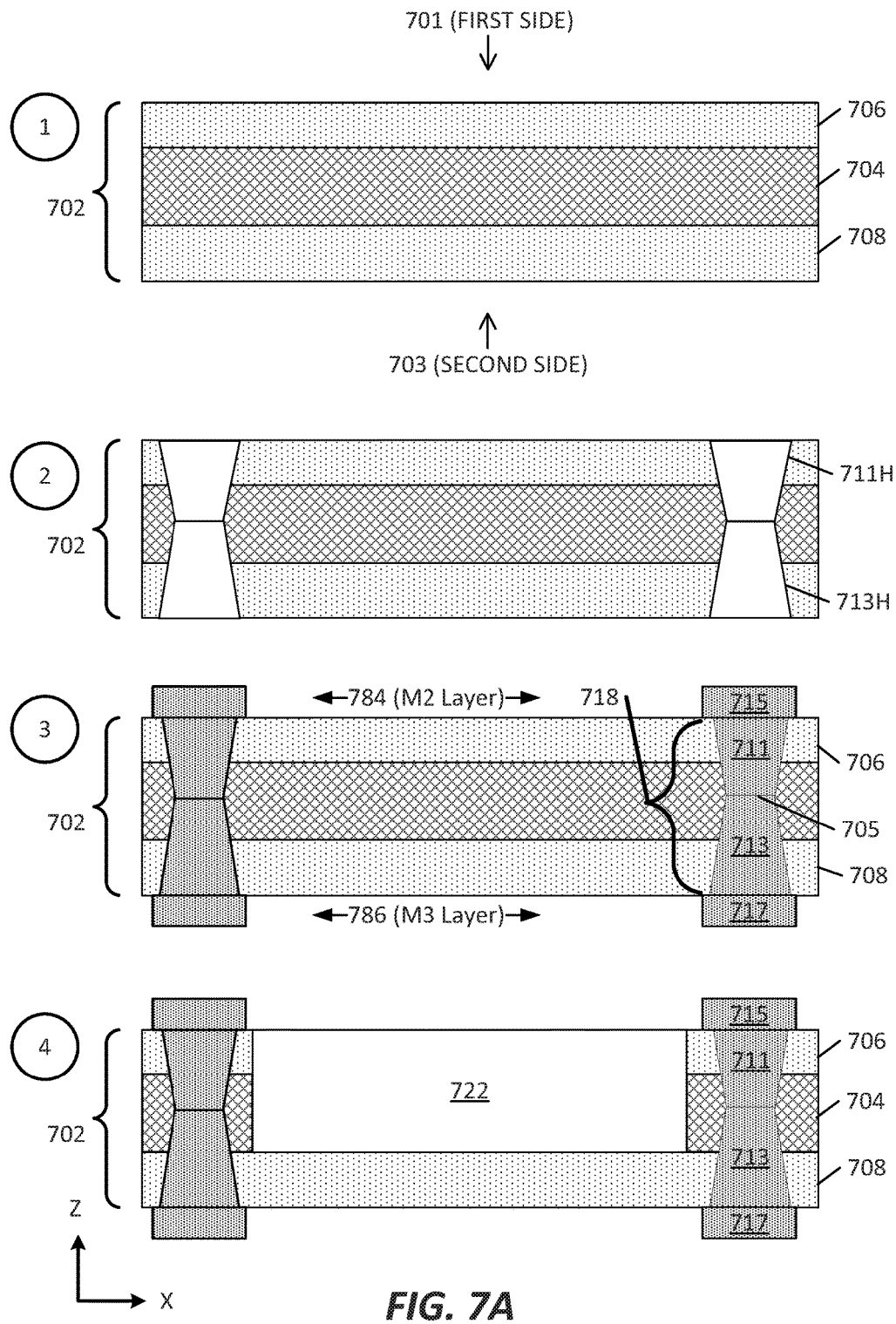
FIG. 7 (which includes FIGS. 7A-7C) illustrates an exemplary sequence of stages for providing/fabricating an EDS that includes single-segment die-penetrating interconnects according to aspects described herein.
Figure 7B:
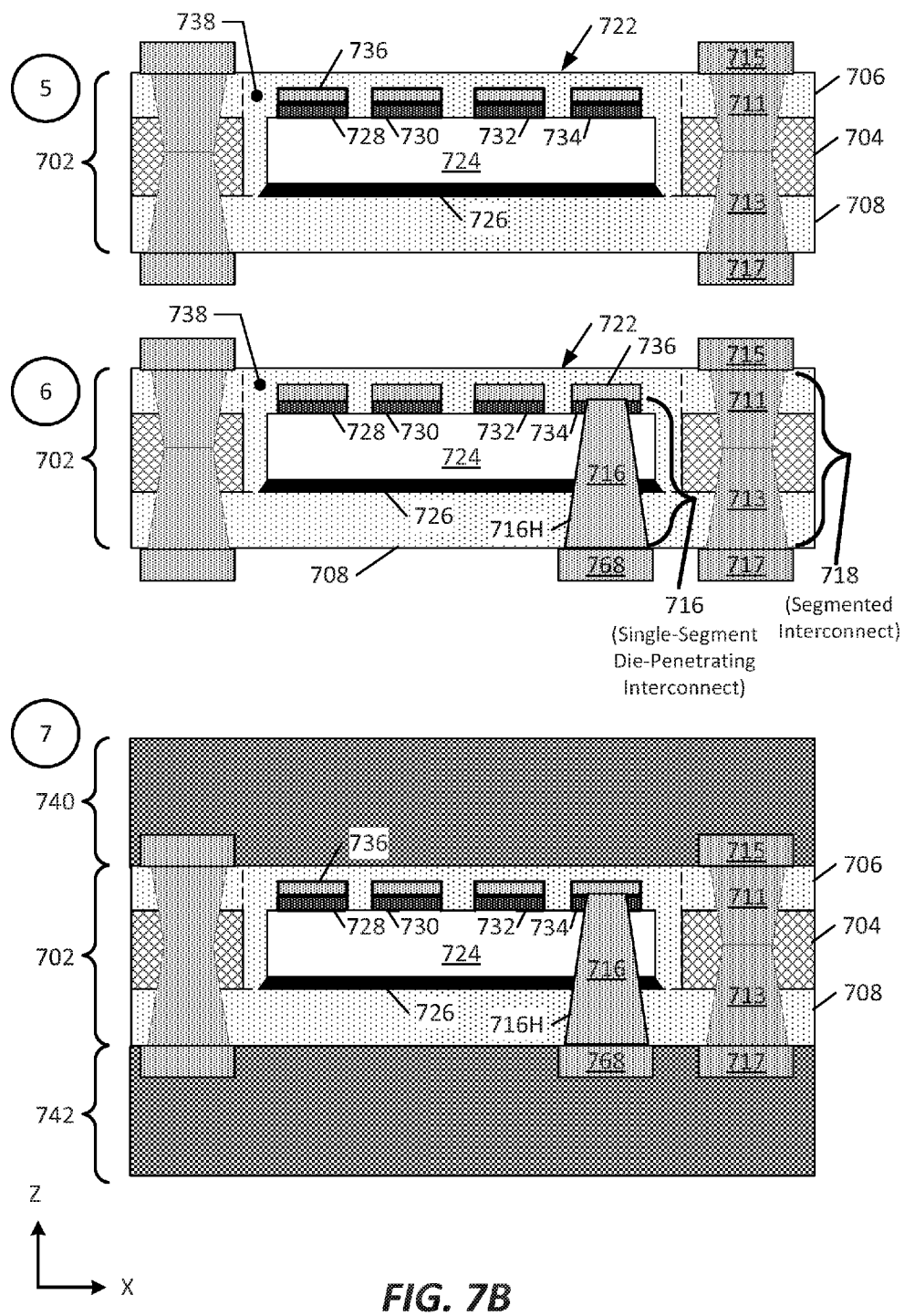

FIGS. 7A-7C illustrate an exemplary sequence for providing/fabricating an EDS that includes single-segment die-penetrating interconnects according to aspects described herein. In some implementations, providing/fabricating an EDS that includes single-segment die-penetrating interconnects includes several process stages. FIG. 7 (which includes FIGS. 7A-7C) illustrates an exemplary sequence of stages for providing/fabricating an EDS that includes single-segment die-penetrating interconnects. In some implementations, the exemplary sequence of FIGS. 7A-7C may be used to fabricate an EDS that includes the single-segment die-penetrating interconnects of FIGS. 3, 4, 6A, and/or 6B. However, for the purpose of simplification, FIGS. 7A-7C will be described in the context of providing/fabricating an EDS of FIG. 3.

It should be noted that the sequence of FIGS. 7A-7C may combine one or more stages in order to simplify and/or clarify the sequence for providing an EDS that includes single-segment die-penetrating interconnects. In some implementations, the order of the process stages may be changed or modified.

Stage 1, as shown in FIG. 7A, illustrates a state after a substrate 702 is provided. The substrate 702 may be a core substrate, a core layer. The substrate 702 may be double sided. The substrate 702 may include a conductive layer 704 that may be formed of a metal such as copper. The conductive layer 704 may be thicker than other conductive layers (e.g., M1 layer 782, M2 layer 784, M3 layer 786, M4 layer 788) in the EDS. The thickness of the conductive layer 704 may provide rigidity and/or structural support to the EDS. The conductive layer 704 may be used as a ground plane or a power plane of the EDS. The substrate 702 may include a first dielectric layer 706 (e.g., a topside dielectric layer) at a first side 701 of the substrate 702 and a second dielectric layer 708 (e.g., a backside dielectric layer) at a second side 703 of the substrate 702. The first dielectric layer 706 and second dielectric layer 708 may sandwich the conductive layer 704 therebetween. The substrate 702 may be formed or provided by a supplier.

Stage 2 illustrates a state after a plurality of holes 711H, 713H are formed in the substrate 702. The plurality of holes 711H, 713H may be defined by the substrate 702. The plurality of holes 711H, 713H can accommodate a segmented interconnect. The plurality of holes 711H, 713H may be formed, for example, with a photolithography process, a mechanical process, and/or a laser drilling process.

Stage 3 illustrates a state after pad or trace 715 of an M2 layer 784 (e.g., a metal layer) and a pad or trace 717 of an M3 layer 786 (e.g., a metal layer) are formed on and/or in the substrate 702. In the exemplary illustration, the pad or trace 715 of the M2 layer 784 may be formed on the first dielectric layer 706. The pad or trace 717 of the M3 layer 786 may be formed on and/or in the second dielectric layer 708. The plurality of holes 711H, 713H may be filled and/or plated with a conductive material, such as the same metal used to for the pad or trace 715 of the M2 layer 784 and the pad or trace 717 of the M3 layer 786. A first segmented interconnect 718 may be formed between the pad or trace 715 and the pad or trace 717 by the connection of conductive material 711 and conductive material 713 (within the plurality of holes 711H, 713H). The first segmented interconnect 718 is referred to as a "segmented" interconnect because it is comprised of segments (e.g., layers) formed of conductive material 711, 713 in the plurality of holes 711H, 713H (respectively). A seam 705 is illustrated between the segments, indicating that while the first segmented interconnect 718 is shown in a complete state in stage 3, the formation of the conductive material 711 in the hole 711H may have taken place at a different stage, at a different time, from formation of the conductive material 713 in the hole 713H. The first segmented interconnect 718 is formed of a plurality of layers, where, for example, each layer is formed from a different segment.

Stage 4 illustrates a state after a cavity 722 (e.g., an opening or void defined by sidewalls) is formed in the substrate 702. The cavity 722 may be formed by methods including, for example, photolithography, mechanical process, and/or laser drilling. The cavity 722 may be defined within the substrate 702 from the first side 701. The cavity 722 may be formed by removing material from the first dielectric layer 706 and conductive layer 704. In some implementations, the cavity 722 may be devoid of the first dielectric layer 706 and the conductive layer 704. The width and depth of the cavity 722 may be chosen to provide space for a die 724, which can be placed within the cavity 722. In some implementations, the depth of the cavity 722 may be greater than or equal to the height of the die 724 plus the thickness of the adhesive, solder, or epoxy 726, that may be used to couple the die 724 to the bottom (e.g., floor) of the cavity 722. Accordingly, depending at least on the height of the die 724, more or less material may be removed from the substrate 702 to form the cavity 722 defined by the substrate 702.

In some implementations, some portion of the conductive layer 704 may remain in the cavity 722; however, in such implementations, measures such as an anti-pad section and/or an insulated section may be implemented to ensure that metallization on the bottom of the die and/or metallization of a single-segment die-penetrating interconnect penetrating the floor of the cavity 722 does not form an unwanted short circuit with the conductive layer 704.

In some implementations, some portion of the second dielectric layer 708 (e.g., the backside dielectric layer) may be removed during formation of the cavity 722. In some implementations, the cavity 722 may be formed by removal of all of the first dielectric layer 706, the conductive layer 704, and the second dielectric layer 708, from within the sidewalls defining the cavity 722 in the substrate 702. In such implementations, the die may be coupled to a layer adjacent to (e.g., below) the second dielectric layer 708.

Stage 5 illustrates a state after which a die 724 has been coupled to the floor of the cavity 722 (e.g., coupled to the second dielectric layer 708 within the cavity 722). The die 724 may be coupled, for example, using an adhesive, solder, or epoxy 726. The die 724 may include a plurality of conductive pads 728, 730, 732, 734 including a first conductive pad 728, a second conductive pad 730, a third conductive pad 732, and a fourth conductive pad 734 on a side of the die 724 distal to the floor of the cavity 722. The plurality of conductive pads 728, 730, 732, 734 may, for example, be formed of gold. Each of the plurality of conductive pads 728, 730, 732, 734 may have a laser stop layer 736 (e.g., a protective conductive layer) deposited, plated, added, on the pad (e.g., a laser stop layer 736 on top of each of the plurality of conductive pads 728, 730, 732, 734). The laser stop layer 736 may be, for example, copper.

Stage 5 further illustrates a state after which the cavity 722 has received a filler-material 738 to encapsulate, protect, and/or immobilize the die 724. The filler-material 738 may at least partially encapsulate the die 724. In some implementations, the filler-material 738 may be applied (e.g., formed, provided) such that a surface of the filler-material 738 is substantially co-planar with a topside surface of the first dielectric layer 706.

Stage 6 illustrates a state after a single-segment die-penetrating fourth interconnect 716 was formed in a hole 716H. The hole 716H may be formed, for example, by drilling through the second dielectric layer 708 (e.g., a portion of the substrate 702, the floor of the cavity 722 formed in the substrate 702) and into the die 724 coupled to the floor of the cavity 722. The hole 716H may extend through and may be defined within the second side 703 of the substrate 702 (e.g., where the second side of the substrate may include the second dielectric layer 708), the die 724, and the conductive pad 734. For example, in the exemplary illustration, the hole 716H extends through and is defined by the second dielectric layer 708 of the substrate 702, the die 724, and the conductive pad 734. In some implementations, the hole 716H may terminate at and/or in the laser stop layer 736 on the conductive pad 734. A conductive material (e.g., the conductive material forming the single-segment die-penetrating fourth interconnect 716) plated and/or filled the hole 716H and coupled to the conductive pad 734 from within the hole 716H. The conductive material forms the interconnect (single-segment die-penetrating fourth interconnect 716) between a surface of the second dielectric layer 708 distal to the floor of the cavity and the conductive pad 734. A pad or trace 768 may be formed on and/or in the second dielectric layer 708.

The single-segment die-penetrating fourth interconnect 716 may be contrasted with the first segmented interconnect 718 to its right. The single-segment die-penetrating fourth interconnect 716 may be described as a unitary single-segment, a unitary structure, an indivisible structure, and/or an undivided structure. The single-segment die-penetrating fourth interconnect 716 may be described as a structure that extends through and is defined within the substrate 702, the die 724, and the conductive pad 734. In contrast, the first segmented interconnect 718 was formed of a stacked set of a first segment of conductive material 711 and a second segment of conductive material 713 and does not extend into and/or through the die 724 and/or any conductive pad on a topside of the die 724.

Stage 7 illustrates a state after providing a first laminate layer 740 (e.g., a topside laminate layer) to the first dielectric layer 706 and a second laminate layer 742 to the second dielectric layer 708. Each of the first laminate layer 740 and second laminate layer 742 may be referred to as a pre-preg (pre-impregnated) layer. Each of the first laminate layer 740 and second laminate layer 742 may include one or more dielectric and electrically conductive layers. The pre-preg layers, for example, may be provided by depositing the layers onto their respective surfaces by spraying. Other ways to provide the pre-preg layers and/or additional layers onto the substrate 702 (e.g., laminating, bonding, attaching, adhering, forming) are known to those of skill in the art.

Stage 8 illustrates a state after a first plurality of holes including a first topside outboard hole 752H, a first topside inboard hole 712H, a second topside inboard hole 714H, and a second topside outboard hole 746H are formed by drilling at predesignated locations beginning on the first laminate layer 740 (e.g., a first pre-preg layer). The first plurality of holes may be formed during a topside drilling process. A second plurality of holes including a first outboard hole 762H, a second outboard hole 756H, and an inboard hole 710H may be formed by drilling at predesignated locations beginning on the second laminate layer 742 (e.g., a second pre-preg layer). The second plurality of holes may be formed during a backside drilling process.

During the topside drilling process, the first topside inboard hole 712H and the second topside inboard hole 714H extend through the first laminate layer 740 and a portion of the filler-material 738 within the cavity 722. The first topside inboard hole 712H and the second topside inboard hole 714H terminate at the laser stop layer 736. The first topside inboard hole 712H and the second topside inboard hole 714H do not extend into and/or through the die 724 (and/or do not extend into and/or through conductive pad 730, 732 at the die 724). The first topside outboard hole 752H and the second topside outboard hole 746H also extend through the first laminate layer 740. The first topside outboard hole 752H terminates on a pad or trace 754 on the first dielectric layer 706. The second topside outboard hole 746H terminates on a pad or trace 715 on the first dielectric layer 706.

During the backside drilling process, the first outboard hole 762H extends through and is defined by the second laminate layer 742 and terminates at a pad or trace 760 of the M3 layer 786 on the second dielectric layer 708. The second outboard hole 756H extends through and is defined by the second laminate layer 742 and terminates at a pad or trace 717 of the M3 layer 786 on the second dielectric layer 708. During the backside drilling process, the inboard hole 710H (which can be plated and/or filled with a conductive material to form the single-segment die-penetrating first interconnect 710) extends through and is defined by the second laminate layer 742, the substrate 702 (e.g., the second dielectric layer 708, a portion of the substrate 702 that lies between the die 724 and the second laminate layer 742 (e.g., the floor of the cavity 722)), the die 724, and the conductive pad 728. For example, in the exemplary illustration, the inboard hole 710H extends through and is defined by the second laminate layer 742, the second dielectric layer 708 of the substrate 702, the die 724, and the conductive pad 728. The inboard hole 710H terminates at or in the laser stop layer 736 on the conductive pad 728.

The first plurality of holes (including the first topside outboard hole 752H, the first topside inboard hole 712H, the second topside inboard hole 714H, and the second topside outboard hole 746H) and the second plurality of holes (including the first outboard hole 762H, the second outboard hole 756H, and the inboard hole 710H) may be formed by methods including, for example, photolithography, mechanical, and/or laser drilling.

Stage 9 illustrates a state after conductive material was used to form a single-segment die-penetrating first interconnect 710 in the inboard hole 710H. The conductive material forms the interconnect (single-segment die-penetrating first interconnect 710) between a surface of the second laminate layer 742 distal to the second side 703 of the substrate 702 (e.g., where the second side of the substrate may include the second dielectric layer 708) and the conductive pad 734. Additionally, stage 9 illustrates conductive material 752 in the first topside outboard hole 752H, conductive material 712 in the first topside inboard hole 7121H, conductive material 714 in the second topside inboard hole 714H, conductive material 746 in second topside outboard hole 746H, conductive material 762 in first outboard hole 762H, conductive material 756 in second outboard hole 756H. Stage 9 further illustrates an M1 layer 782 formed on and/or in the first laminate layer 740 and an M4 layer 788 formed on and/or in the second laminate layer 742. The M1 layer 782 may include a first horizontal trace 790 and a second horizontal trace 792. The M4 layer 788 may include a first node 764, a second node 766, and a fourth node 770 (e.g., where a node may be a conductive pad or trace).

A guard area (not shown) such as an anti-pad section and/or an insulated section may be implemented that is free of the adhesive, solder, or epoxy 726 used to couple the die 724 to the substrate 702 may be provided around the single-segment die-penetrating first interconnect 710 and the single-segment die-penetrating fourth interconnect 716 to preclude a short circuit to the adhesive, solder, or epoxy 726 if, for example, the adhesive, solder, or epoxy 726 is electrically conductive.

In some implementations, several EDSs may be concurrently fabricated on a core substrate, and a singulation process may be performed to cut the core substrate into individual EDSs.

Exemplary Method for Fabricating an Embedded Die Substrate (EDS)

Figure 8:
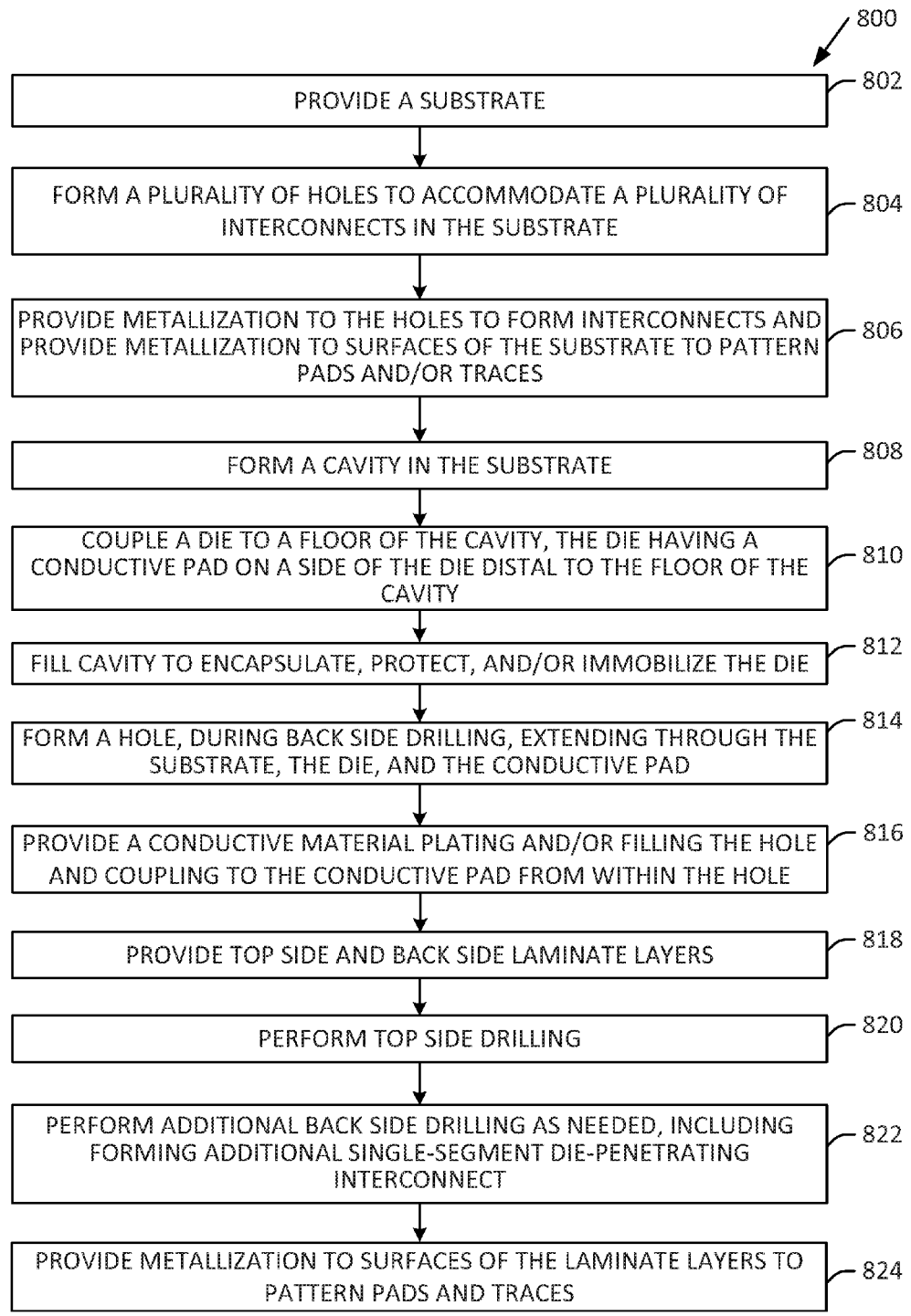
FIG. 8 illustrates a flow diagram of an exemplary method for fabricating an EDS including a single-segment die-penetrating interconnect according to aspects described herein.

FIG. 8 illustrates a flow diagram 800 of an exemplary method of fabricating an EDS including a single-segment die-penetrating interconnect. In some implementations, the exemplary method of FIG. 8 may be used to fabricate an EDS that includes the single-segment die-penetrating interconnects of FIGS. 3, 4, 6A, and/or 6B. However, for the purpose of simplification, FIG. 8 will be described in the context of providing/fabricating an EDS of FIG. 3.

It should be noted that the sequence of blocks presented in FIG. 8 may combine one or more operations in order to simplify and/or clarify the method for fabricating an EDS that includes single-segment die-penetrating interconnects. In some implementations, the order of the blocks may be changed or modified.

A substrate may be provided 802. The substrate may have a first side and an opposite second side. The substrate may be double sided. The substrate may be a core substrate (e.g., a core layer). The substrate may include a conductive layer that may be formed of a metal such as copper. The substrate may include a first dielectric layer on the first side of the substrate (e.g., a topside dielectric layer) and may include a second dielectric layer (e.g., a backside dielectric layer) on the second side of the substrate. The first dielectric layer and second dielectric layer may sandwich the conductive layer therebetween.

A plurality of holes may be formed in the substrate to accommodate a plurality of interconnects 804. For example, a photolithography process, a mechanical process, and/or a laser drilling process may be used to form the plurality of holes. In some implementations, the plurality of holes may be formed using a laser drill.

Metallization (e.g., conductive material) may be provided 806 to the plurality of holes to form interconnects and may be patterned on the first dielectric layer and second dielectric layer to form pads and/or traces.

A cavity may be formed in the substrate 808. The cavity may be defined within the substrate. As described herein, a cavity may be an opening or void defined by sidewalls within the substrate. The cavity may be formed and defined within the substrate from the first side of the substrate. The cavity may be formed by removing material from the first dielectric layer and conductive layer. The width and depth of the cavity may be chosen to provide space for a die, which may be placed within the cavity. In some implementations, a depth of the cavity may be greater than or equal to the height of the die plus the thickness of the adhesive, solder, or epoxy that couples the die to the bottom (or floor) of the cavity.

A die may be coupled to the floor of the cavity (e.g., coupled to the second dielectric layer exposed within the cavity) 810. The die may have a first side coupled to the floor of the cavity and an opposite second side distal to the floor of the cavity. The die may be coupled, for example, using an adhesive, solder, or epoxy. The die may include a plurality of conductive pads. The plurality of conductive pads may be formed, for example, of gold. The die may have at least one conductive pad on a side of the die distal to the floor of the cavity (the opposite second side of the die). The plurality of conductive pads may each have a laser stop layer deposited, plated, added, on top of the pad. The laser stop layer may be a covering layer of metal such as copper. The metal of the laser stop layer may be dissimilar to the metal of an underlying conductive pad.

The cavity may receive a filler-material to encapsulate, protect, and/or immobilize the die 812. The filler-material may at least partially encapsulate the die. In some implementations, the filler-material may be applied (e.g., formed, provided) such that a surface of the filler-material is substantially co-planar with a surface of the first dielectric layer.

A hole may be formed 814 (e.g., provided) by drilling to extend through the substrate, the die, and the conductive pad. For example, the hole may extend through and be defined within the second side of the substrate (e.g., a layer of the substrate to which the die is coupled, a layer of the substrate having a surface described as the floor of the cavity, a layer of the substrate that includes a second dielectric layer), extend into and/or through the die coupled to the floor of the cavity, and extend into and/or through the conductive pad on the side of the die distal to the floor of the cavity. In some implementations, the hole may extend into and/or through the die and terminate at, or expose, a surface of the conductive pad on the die. The surface of the conductive pad may be an undersurface of the conductive pad. The undersurface of the conductive pad may be in a plane lying substantially along an interface between a top of the die and a bottom of the conductive pad.

A conductive material may be provided to plate and/or fill the hole and couple to the conductive pad from within the hole 816. The conductive material may plate the sidewalls of the hole and/or fill the hole completely. The hole, which extends through and is defined within the second dielectric layer of the substrate, the die, and into and/or through the conductive pad may be formed at one time, or in other words, during one process or in one action. The conductive material, which may extend from the second dielectric layer of the EDS, through the die, and into and/or through the conductive pad on the side of the die distal to the side of the die coupled to the floor of the cavity, may be a unitary, indivisible, and/or an undivided structure. Accordingly, because the conductive material extends through the substrate, the die, and the conductive pad, and may be formed as a unitary, indivisible, and/or an undivided segment (e.g., one structure, one segment, a single segment), it may be referred to as a single-segment die-penetrating interconnect. Additionally, the hole is formed during EDS integration; for example, during a backside drilling process (e.g., operation, action) during EDS integration. As previously noted, entities are loathe to drill holes into die during EDS integration out of fear of damaging the die. However, it has been discovered that the aspects described herein may reduce the cost of a die by eliminating at least some TSV from the die (thereby reducing die mask count and the number of operations used in fabricating the die). Additionally, because the single-segment die-penetrating interconnect formed according to aspects described herein may be formed as a single-segment from one conductive material, it can be formed from a conductive material that has better thermal conductivity than a material used for fabrication of TSV in a die, such as gold. For example, in some implementations a conductive material that may be used for formation of the single-segment die-penetrating interconnect may be copper. The thermal conductivity of a copper single-segment die-penetrating interconnect has been found to have a thermal conductivity that is better by 30 percent than gold for gallium arsenide (GaAs) die and better by 100 percent than tungsten (W) for bulk/Silicon-On-Insulator (SOI) CMOS (SOI CMOS).

A first laminate layer may be provided to the first dielectric layer and a second laminate layer may be provided to the second dielectric layer 818.

A topside drilling process may be performed if appropriate 820.

Additional backside drilling may be performed if appropriate 822, where the backside drilling may include formation of additional holes for additional single-segment die-penetrating interconnects if appropriate. Because an additional layer (the second laminate layer) was added to the overall EDS structure, during the backside drilling process, a hole designated as a single-segment die-penetrating interconnect may extend through and be defined within the second laminate layer, the layer(s) of the substrate between the die and the second laminate layer (e.g., the floor of the cavity), the die, and a conductive pad on a topside of the die. In some implementations, the hole may terminate at a laser stop layer on the conductive pad.

An M1 layer (e.g., conductive material/electrically conductive layer/metallization layer) may be formed on and/or in the first laminate layer and an M4 layer may be formed on and/or in the second laminate layers to pattern pads and/or traces 824.

Figure 9:
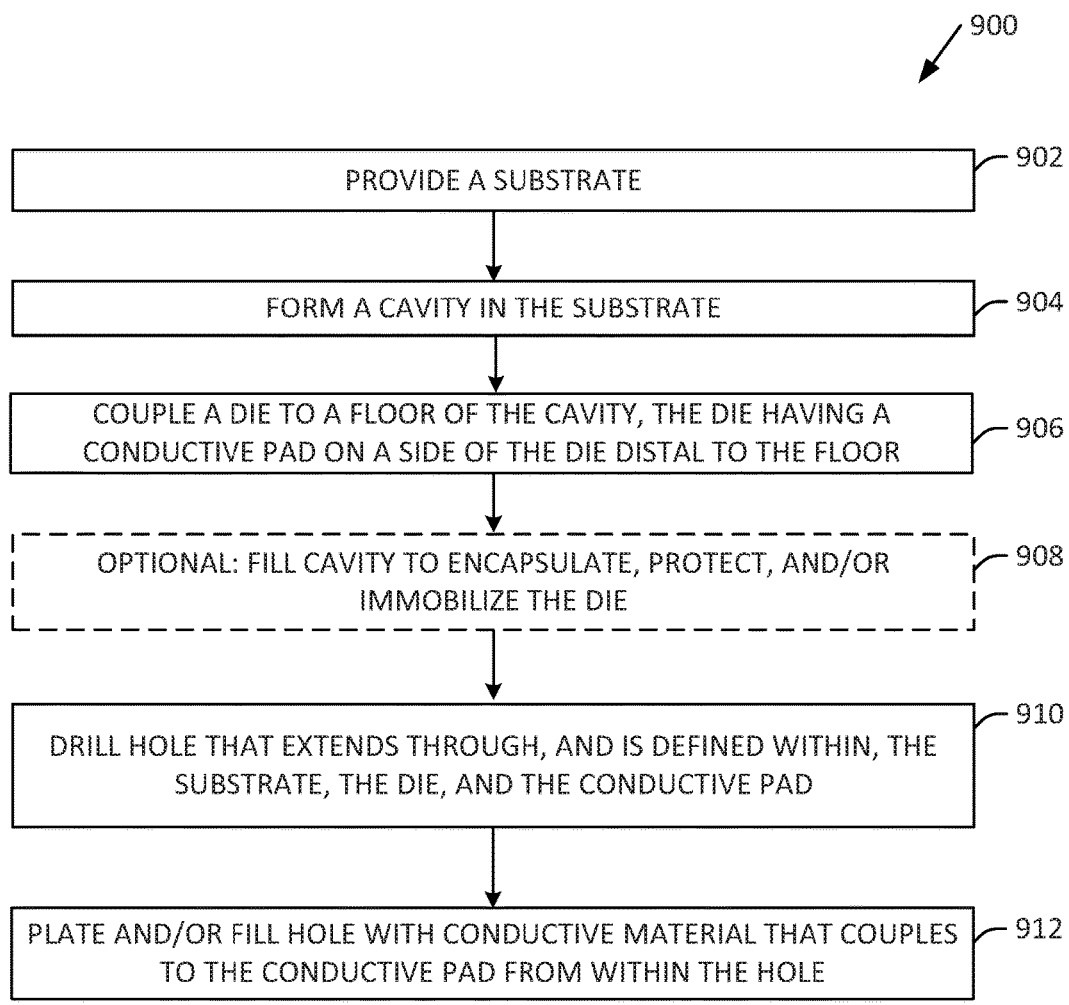
FIG. 9 illustrates another flow diagram of an exemplary method for fabricating an EDS including a single-segment die-penetrating interconnect according to aspects described herein.

FIG. 9 illustrates another flow diagram 900 of an exemplary method for fabricating an EDS including a single-segment die-penetrating interconnect. In some implementations, the exemplary method of FIG. 9 may be used to fabricate an EDS that includes the single-segment die-penetrating interconnects of FIGS. 3, 4, 6A, and/or 6B. However, for the purpose of simplification, FIG. 9 will be described in the context of providing/fabricating an EDS of FIG. 3.

It should be noted that the sequence of blocks presented in FIG. 9 may combine one or more operations in order to simplify and/or clarify the method for fabricating an EDS that includes single-segment die-penetrating interconnects. In some implementations, the order of the blocks may be changed or modified.

A substrate having a first side and an opposite second side may be provided 902. A cavity defined within the substrate (e.g., an opening or void defined by sidewalls within the substrate) may be formed within the substrate 904. The cavity defined within the substrate may be formed from the first side of the substrate. A die may be coupled to the floor of the cavity 906, the die having a conductive pad on a side of the die distal to the floor of the cavity. Optionally, a filler-material may be added 908 to the cavity. The filler-material may act, for example, to encapsulate, protect, and/or immobilize the die.

A process of drilling a hole that extends through, and is defined within, the substrate, the die, and the conductive pad may be conducted 910. The hole may expose a surface of the conductive pad (e.g., a surface of the conductive pad accessed/visible from within the hole). The hole may be plated and/or filled 912 with a conductive material that couples to the conductive pad from within the hole. In some implementations, the die may be coupled to the floor of the cavity before drilling the hole. In some implementations, drilling the hole may be performed at one time. In other words, the entire length of the hole may be formed during one process (e.g., a backside drilling process). In some implementations, the hole may be formed to be concentric along a linear axis extending through the second side of the substrate, the die, and the conductive pad. In some implementations, the hole may be formed to be a single linear hole along a length of the hole. In some implementations, the conductive material plating and/or filling the hole may be formed as a unitary single-segment. In some implementations, the conductive material may extend between and through the second side of the substrate, the die, and the conductive pad and may be formed as only one layer (e.g., only one segment of one conductive material, only one layer of one conductive material). In some implementations, the conductive material may form an interconnect between a surface of the second side of the substrate distal to the floor of the cavity and the conductive pad. In some implementations, the conductive material may form an interconnect between an opening of the hole on a backside surface of the substrate and the conductive pad. In some implementations, the interconnect may be formed as a single segment (e.g., a single-segment die-penetrating interconnect). In some implementations, the interconnect is a unitary, indivisible, and/or an undivided structure.

Figure 10:
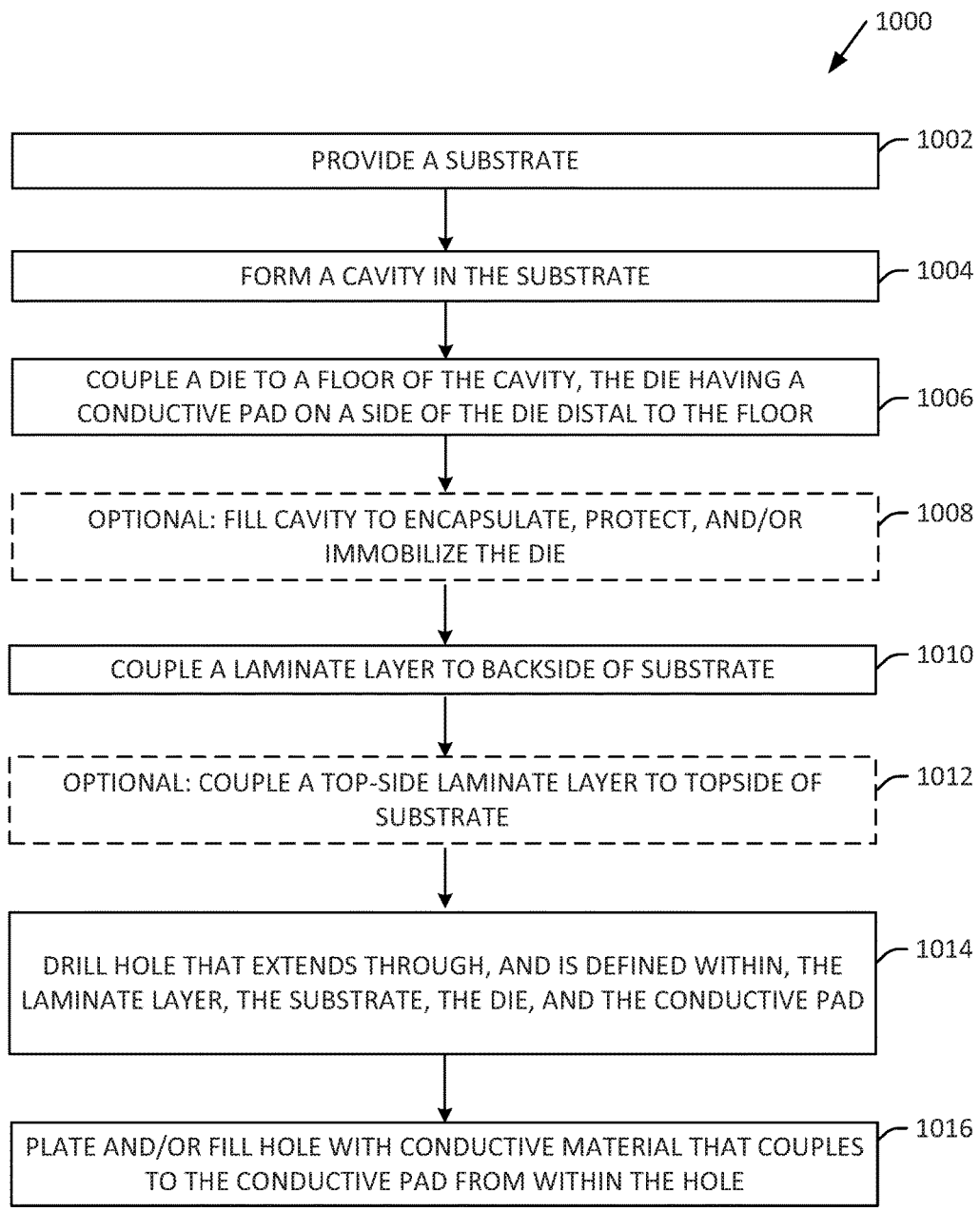
FIG. 10 illustrates another flow diagram of an exemplary method for fabricating an EDS including a single-segment die-penetrating interconnect according to aspects described herein.

FIG. 10 illustrates another flow diagram 1000 of an exemplary method for fabricating an EDS including a single-segment die-penetrating interconnect. In some implementations, the exemplary method of FIG. 10 may be used to fabricate an EDS that includes the single-segment die-penetrating interconnects of FIGS. 3, 4, 6A, and/or 6B. However, for the purpose of simplification, FIG. 10 will be described in the context of providing/fabricating an EDS of FIG. 4.

It should be noted that the sequence of blocks presented in FIG. 10 may combine one or more operations in order to simplify and/or clarify the method for fabricating an EDS that includes single-segment die-penetrating interconnects. In some implementations, the order of the blocks may be changed or modified.

A substrate having a first side and an opposite second side may be provided 1002. A cavity defined within the substrate (e.g., an opening or void defined by sidewalls within the substrate) may be formed in the substrate 1004. The cavity defined within the substrate may be formed from the first side of the substrate. A die may be coupled to the floor of the cavity 1006, the die having a conductive pad on a side of the die distal to the floor of the cavity. Optionally, a filler-material may be added 1008 to the cavity. The filler-material may act, for example, to encapsulate, protect, and/or immobilize the die.

A laminate layer (e.g., a second laminate layer) may be coupled 1010 to the second side of the substrate (e.g., a backside of the substrate). Optionally, a first laminate layer may be coupled 1012 to the first side of the substrate (e.g., a topside of the substrate).

A process of drilling a hole that extends through, and is defined within, the second laminate layer, the substrate, the die, and the conductive pad may be conducted 1014. The hole may expose a surface of a conductive pad (e.g., a surface of the conductive pad accessed/visible from within the hole). The hole may be plated and/or filled 1016 with a conductive material that couples to the conductive pad from within the hole.

In some implementations, the die may be coupled to the floor of the cavity and the laminate layer may be coupled to the second side of the substrate before drilling the hole. In some implementations, drilling the hole may be performed at one time. In other words, the entire length of the hole may be formed during one process (e.g., a backside drilling process). In some implementations, the hole may be formed to be concentric along a linear axis extending through the laminate layer, the second side of the substrate, the die, and the conductive pad. In some implementations, the hole may be formed to be a single linear hole along a length of the hole. In some implementations, the conductive material plating and/or filling the hole may be formed as a unitary single-segment. In some implementations, the conductive material may extend between and through the laminate layer, the second side of the substrate, the die, and the conductive pad and may be formed as only one layer (e.g., only one segment of one conductive material, only one layer of one conductive material). In some implementations, the conductive material may form an interconnect between a surface of the laminate layer distal to the floor of the cavity and the conductive pad. In some implementations, the conductive material may form an interconnect between an opening of the hole on a backside surface of the second laminate layer and the conductive pad. In some implementations, the interconnect may be formed as a single segment (e.g., a single-segment die-penetrating interconnect). In some implementations, the interconnect is a unitary, indivisible, and/or an undivided structure.

Exemplary Electronic Devices

Figure 11:
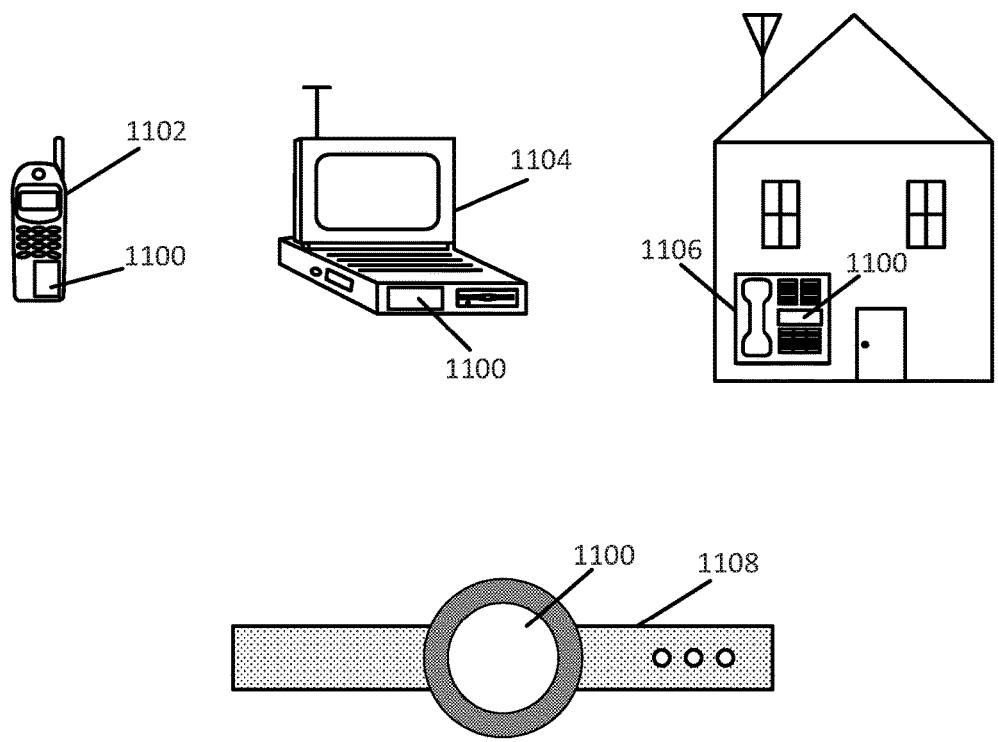
FIG. 11 illustrates various electronic devices that may be integrated with any of the aforementioned EDS that include a single-segment die-penetrating interconnect.

FIG. 11 illustrates various electronic devices that may be integrated with any of the aforementioned EDS that include a single-segment die-penetrating interconnect. For example, electronic devices such as a mobile phone device 1102, a laptop computer device 1104, a fixed location terminal device 1106, a wearable device 1108 may include an EDS including single-segment die-penetrating interconnects 1100 as described herein. The electronic devices illustrated in FIG. 11 are exemplary. For example, an EDS including single-segment die-penetrating interconnects 1100 as described herein may be incorporated into other electronic devices including, but not limited to, a group of devices that includes a mobile device, a hand-held personal communication system (PCS) unit, a personal digital assistant, a portable data terminal, a global positioning system (GPS) enabled device, a navigation device, a set top box, a music player, a video player, an entertainment unit, a fixed location terminal (e.g., meter reading equipment), a communications device, a mobile phone, a smartphone, a tablet computer, a computer, a wearable device (e.g., watch, glasses), an Internet of things (IoT) device, a laptop computer, a server, a router, an electronic device implemented in an automotive vehicle (e.g., including an autonomous automotive vehicle), or any other device that stores or retrieves data or computer instructions, or any combination thereof.

One or more of the components, processes, features, and/or functions illustrated in FIGS. 3, 4, 5A, 5B, 6A, 6B, 7A-7C, 8, 9, and/or 10 may be rearranged and/or combined into a single component, process, feature or function or embodied in several components, processes, or functions. Additional elements, components, processes, and/or functions may also be added without departing from the disclosure. It should also be noted that FIGS. 3, 4, 5A, 5B, 6A, 6B, 7A-7C, 8, 9, and/or 10 and their corresponding descriptions in the present disclosure are not limited to dies and/or ICs. In some implementations, FIGS. 3, 4, 5A, 5B, 6A, 6B, 7A-7C, 8, 9, and/or 10 and their corresponding descriptions may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, an embedded die substrate, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

In addition, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device, comprising:
a substrate having a first side and an opposite second side, wherein the substrate is a core substrate including a conductive layer, a first dielectric layer coupled to a first surface of the conductive layer, and a second dielectric layer coupled to an opposite second surface of the conductive layer;
a cavity defined within the substrate, wherein:
the cavity is devoid of the first dielectric layer and the conductive layer, and
a floor of the cavity is defined by the second dielectric layer,
wherein sidewalls of the cavity are defined by coplanar surfaces of the first dielectric layer and the conductive layer;
a die coupled to the floor of the cavity, the die having a conductive pad on a side of the die distal to the floor of the cavity;
a hole extending through and defined within the second dielectric layer, the die, and the conductive pad; and
a conductive material within the hole and extending between and through the second dielectric layer, the die, and the conductive pad.

2. The device of claim 1, wherein the hole is continuous through the second dielectric layer, the die, and the conductive pad.

3. The device of claim 1, wherein the hole is concentric along a linear axis extending through the second dielectric layer, the die, and the conductive pad.

4. The device of claim 1, wherein the hole is a single linear hole along a length of the hole.

5. The device of claim 1, wherein the conductive material is a unitary single-segment.

6. The device of claim 1, wherein the conductive material includes only one layer.

7. The device of claim 1, wherein the conductive material couples to the conductive pad from within the conductive pad and terminates at a side of the conductive pad distal to the floor of the cavity.

8. A device, comprising:
a substrate having a first side and an opposite second side, wherein the substrate is a core substrate including a conductive layer, a first dielectric layer coupled to a first surface of the conductive layer, and a second dielectric layer coupled to an opposite second surface of the conductive layer;
a cavity defined within the substrate, wherein:
the cavity is devoid of the first dielectric layer and the conductive layer, and
a floor of the cavity is defined by the second dielectric layer,
wherein sidewalls of the cavity are defined by coplanar surfaces of the first dielectric layer and the conductive layer;
a die coupled to the floor of the cavity, the die having a conductive pad on a side of the die distal to the floor of the cavity;
a laminate layer coupled to the second side of the substrate, the second dielectric layer sandwiched between the die and the laminate layer;
a hole extending through and defined within the laminate layer, the second dielectric layer, the die, and the conductive pad; and
a conductive material within the hole and extending between and through the laminate layer, the second dielectric layer, the die, and the conductive pad.

9. The device of claim 8, wherein the hole is continuous through the laminate layer, the second dielectric layer, the die, and the conductive pad.

10. The device of claim 8, wherein the hole is concentric along a linear axis extending through the laminate layer, the second dielectric layer, the die, and the conductive pad.

11. The device of claim 8, wherein the hole is a single linear hole along a length of the hole.

12. The device of claim 8, wherein the conductive material is a unitary single-segment.

13. The device of claim 8, wherein the conductive material includes only one layer.

14. The device of claim 8, wherein the device is incorporated into a device selected from a group including at least one of a mobile device, a hand-held personal communication system (PCS) unit, a personal digital assistant, a portable data terminal, a global positioning system (GPS) enabled device, a navigation device, a set top box, a music player, a video player, an entertainment unit, a fixed location terminal, a communications device, a mobile phone, a smartphone, a tablet computer, a computer, a wearable device, an Internet of things (IoT) device, a laptop computer, a server, a router, and an electronic device implemented in an automotive vehicle.

15. A device, comprising:
a substrate having a first side and an opposite second side,
wherein the substrate is a core substrate including a conductive layer, a first dielectric layer coupled to a first surface of the conductive layer, and a second dielectric layer coupled to an opposite second surface of the conductive layer;
a cavity defined within the substrate, wherein:
the cavity is devoid of the first dielectric layer and the conductive layer, and
a floor of the cavity is defined by the second dielectric layer,
wherein sidewalls of the cavity are defined by coplanar surfaces of the first dielectric layer and the conductive layer;
a die coupled to the floor of the cavity, the die having a conductive pad on a side of the die distal to the floor of the cavity; and
means for an interconnect to penetrate the substrate and the die and couple the conductive pad to a node opposite to the conductive pad on the second side of the substrate.

16. The device of claim 15, wherein the means for the interconnect comprises:
a hole extending through and defined within the second dielectric layer, the die, and the conductive pad; and
a conductive material within the hole and extending between and through the second dielectric layer, the die, and the conductive pad.

17. The device of claim 15, wherein the means for the interconnect is continuous through the second dielectric layer, the die, and the conductive pad.

18. The device of claim 15, wherein the means for the interconnect is concentric along a linear axis extending through the second dielectric layer, the die, and the conductive pad.

19. The device of claim 15, wherein the means for the interconnect includes a single linear hole along a length of the hole.

20. The device of claim 15, wherein the means for the interconnect includes a conductive material formed as a unitary single-segment that couples to the conductive pad from within the conductive pad and terminates at a side of the conductive pad distal to the floor of the cavity.

21. A method of fabricating an embedded die substrate, comprising:
providing a substrate having a first side and an opposite second side,
wherein the substrate is a core substrate including a conductive layer, a first dielectric layer coupled to a first surface of the conductive layer, and a second dielectric layer coupled to an opposite second surface of the conductive layer;
forming a cavity defined within the substrate, wherein:
the cavity is devoid of the first dielectric layer and the conductive layer, and
a floor of the cavity is defined by the second dielectric layer,
wherein sidewalls of the cavity are defined by coplanar surfaces of the first dielectric layer and the conductive layer;
coupling a die to the floor of the cavity, the die having a conductive pad on a side of the die distal to the floor of the cavity;
drilling a hole extending through and defined within the second dielectric layer, the die, and the conductive pad; and
plating and/or filling the hole with a conductive material extending between and through the second dielectric layer, the die, and the conductive pad, and that couples to the conductive pad from within the hole.

22. The method of claim 21, wherein the die is coupled to the floor of the cavity before drilling the hole.

23. The method of claim 21, wherein drilling the hole is performed at one time.

24. The method of claim 21, wherein the hole is formed to be concentric along a linear axis extending through the second dielectric layer, the die, and the conductive pad.

25. The method of claim 21, wherein the hole is formed to be a single linear hole along a length of the hole.

26. The method of claim 21, wherein the conductive material is formed as a unitary single-segment.

27. The method of claim 21, wherein the conductive material extending between and through the second dielectric layer, the die, and the conductive pad is formed as only one layer.

28. The method of claim 21, further comprising:
coupling a laminate layer to the second side of the substrate,
wherein, the hole is further drilled to extend through and be defined within the laminate layer, and the conductive material further extends between and through the laminate layer.

* * * * *